United States Patent [19]

Tanaka et al.

[11] Patent Number: 5,693,439
[45] Date of Patent: Dec. 2, 1997

[54] EXPOSURE METHOD AND APPARATUS

[75] Inventors: Yasuaki Tanaka, Chigasaki; Seiro Murakami, Chiba; Kenji Nishi, Yokohama, all of Japan

[73] Assignee: Nikon Corporation, Tokyo, Japan

[21] Appl. No.: 482,555

[22] Filed: Jun. 7, 1995

Related U.S. Application Data

[62] Division of Ser. No. 345,325, Nov. 21, 1994, Pat. No. 5,448,332, which is a continuation of Ser. No. 172,098, Dec. 23, 1993, abandoned.

[30] Foreign Application Priority Data

| Dec. 25, 1992 | [JP] | Japan | 4-346073 |
| Mar. 3, 1993 | [JP] | Japan | 5-42426 |
| Mar. 26, 1993 | [JP] | Japan | 5-67271 |

[51] Int. Cl.⁶ ............... G03F 7/207; G03F 7/22
[52] U.S. Cl. ............................. 430/30; 430/22
[58] Field of Search .................. 430/30, 22; 437/924

[56] References Cited

FOREIGN PATENT DOCUMENTS

| 55-71025A | 5/1980 | Japan | 437/924 |
| 61-131441 | 6/1986 | Japan | 437/924 |
| 62-293633 | 12/1987 | Japan | 437/924 |
| 63-12134 | 1/1988 | Japan | . |
| 63-13329A | 1/1988 | Japan | 437/924 |
| 63-307729A | 12/1988 | Japan | 437/924 |
| 4-209516A | 7/1992 | Japan | 437/924 |
| 5-3144A | 1/1993 | Japan | 437/924 |
| 5-217845A | 8/1993 | Japan | 437/927 |

OTHER PUBLICATIONS

Wuestenhagen, IBM Technical Disclosure Bulletin, vol. 16, No. 7, pp. 2306–2307, Dec. 1973.

Primary Examiner—Cynthia Hamilton
Attorney, Agent, or Firm—Shapiro and Shapiro

[57] ABSTRACT

An apparatus for exposing a pattern, formed on a mask, on each of a plurality of partitioned areas on a photosensitive substrate by a step-and-repeat scheme includes a projection optical system for projecting the pattern of the mask on the photosensitive substrate, a substrate stage for holding the photosensitive substrate and two-dimensionally moving the photosensitive substrate within a plane perpendicular to the optical axis of the projection optical system, a detection unit for projecting a pattern image having a predetermined shape on the photosensitive substrate and photoelectrically detecting light reflected by the photosensitive substrate to detect a position at each of a plurality of points on the photosensitive substrate along the optical axis of the projection optical system, and a measurement unit for, when each of a plurality of measurement points in a partitioned area on which a pattern of the mask is to be exposed next coincides with or approaches the pattern image, detecting an offset amount between an imaging plane of the projection optical system and the next partitioned area along the optical axis during a stepping operation of the substrate stage, wherein the imaging plane and the next partitioned area are relatively moved along the optical axis in accordance with the measured offset amount before the pattern of the mask is exposed on the next partitioned area.

25 Claims, 20 Drawing Sheets

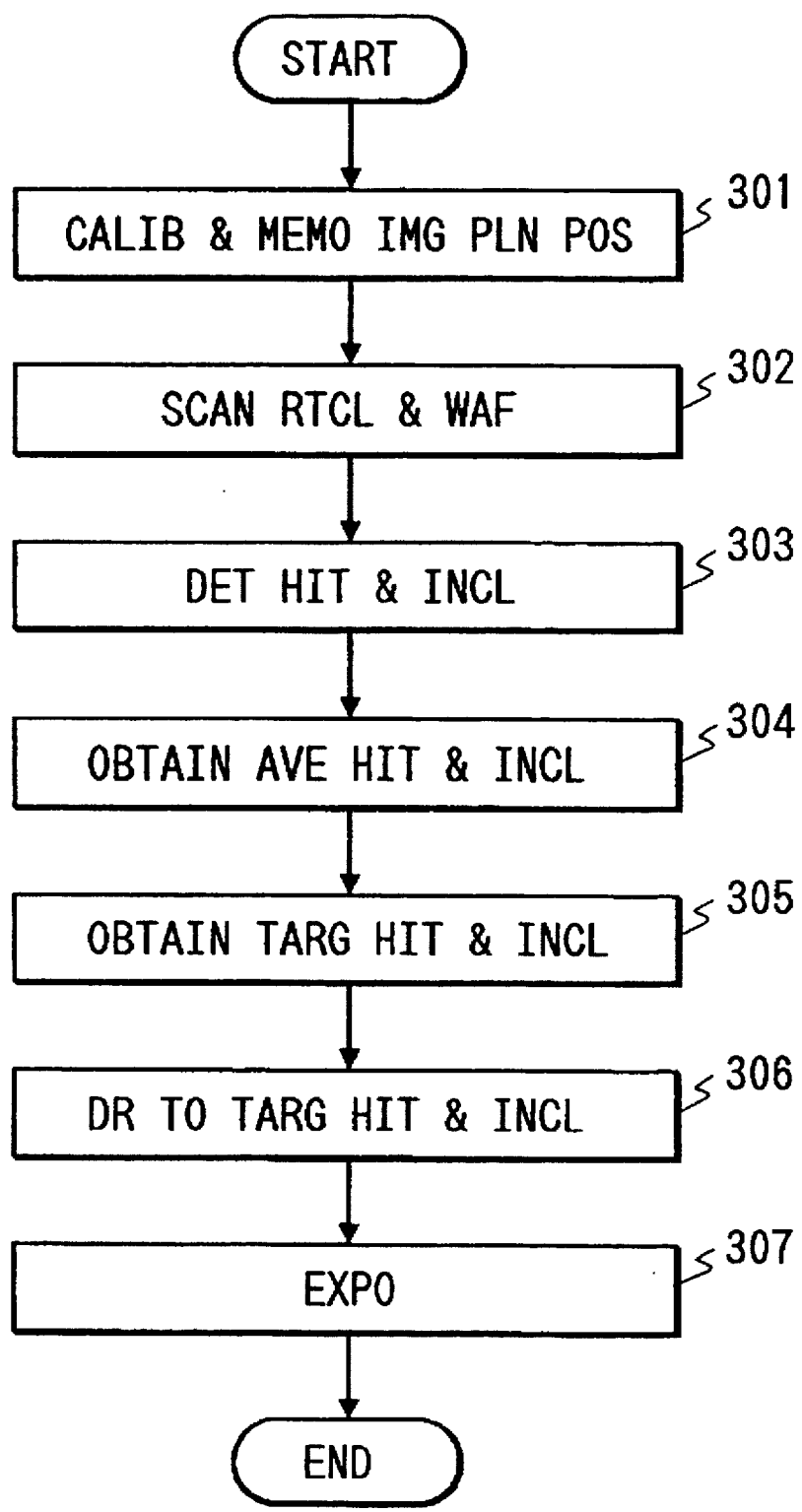

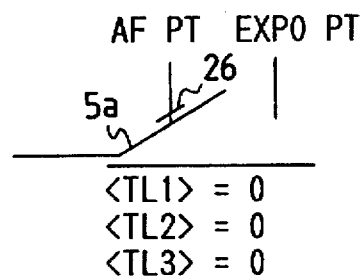
FIG. 13A
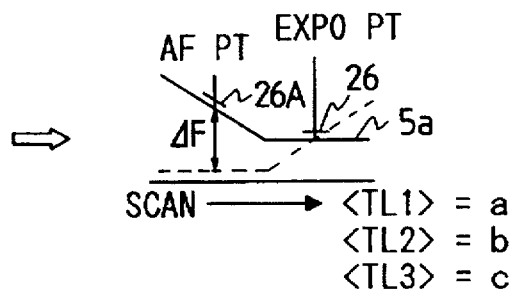
FIG. 13B
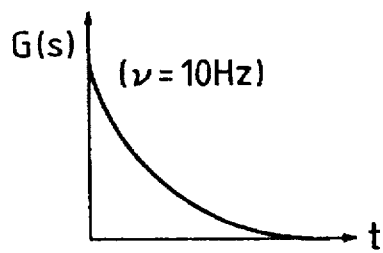
FIG. 14A
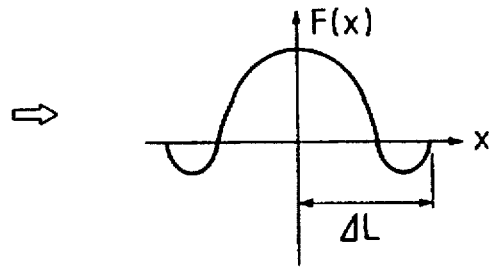
FIG. 14B
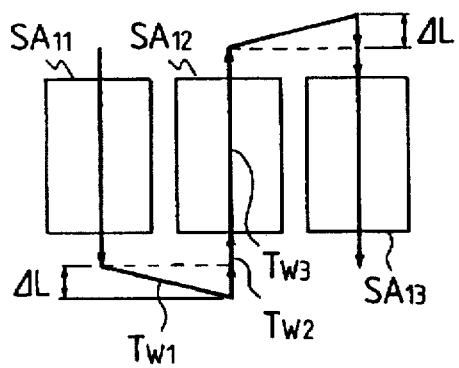
FIG. 15A
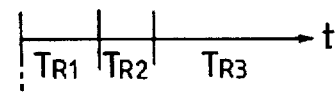
FIG. 15B
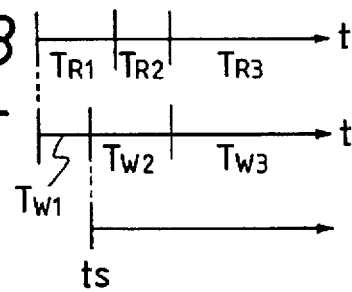
FIG. 15C
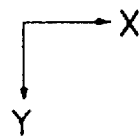

EXPOSURE METHOD AND APPARATUS

This is a division of application Ser. No. 08/345,325, filed Nov. 21, 1994, now U.S. Pat. No. 5,448,332, which is a continuation of application Ser. No. 08/172,098, filed Dec. 23, 1993, (abandoned).

BACKGROUND OF THE INVENTION

1. Field of the Invention

The present invention relates to an exposure apparatus designed to transfer a pattern formed on a mask or reticle onto a photosensitive substrate and used in a photolithographic process for manufacturing a semiconductor element, a liquid crystal display element, a thin-film magnetic head, or the like and, more particularly, to a method and apparatus for positioning a photosensitive substrate with respect to a predetermined reference plane (e.g., the imaging plane of a projection optical system).

2. Related Background Art

Conventionally, an exposure apparatus incorporates a plane position detection unit for performing proximity gap setting, focusing, leveling, and the like. Especially in a projection exposure apparatus, when a reticle pattern is to be projected/exposed on a photosensitive substrate (a wafer or glass plate on which a photoresist is coated) via a projection optical system having a high resolving power, a surface of the photosensitive substrate must be accurately aligned with the imaging plane (the projection imaging plane for the reticle pattern) of the projection optical system, that is, focusing must be performed, as disclosed in U.S. Pat. No. 4,650,983.

In order to achieve proper focusing throughout the projection field of view of the projection optical system, some consideration needs to be given to the inclination of a partial area, on the projection optical system, which enters the projection field of view, i.e., one projection/exposure area (shot area). As a technique of performing a focusing operation in consideration of the inclination of the surface of one shot area on a photosensitive substrate, a technique disclosed in U.S. Pat. No. 4,558,949 and the like is known. Especially in U.S. Pat. No. 4,383,757, there is disclosed a technique of projecting the spots of light beams on four points on a photosensitive substrate via a projection optical system, and photoelectrically detecting spot images formed by the reflected light beams, thus performing focusing and inclination correction (leveling) with respect to the photosensitive substrate.

A multi-point oblique incident type focus detection system like the one disclosed in, e.g., U.S. Pat. No. 5,118,957 is also known as a system developed from the oblique incident type focus detection system disclosed in U.S. Pat. No. 4,558,949. In this system, pin hole images are projected on a plurality of points (e.g., five points) in a shot area on a projection optical system by an oblique incident scheme without the mediacy of a projection optical system, and the respective reflected images are received by a two-dimensional position detection element (CCD) at once. The system is generally called an oblique incident type multi-point AF system, which can execute focus detection and inclination detection with high precision.

As a conventional projection exposure apparatus, a reduction projection exposure apparatus of a step-and-repeat scheme, a so-called stepper, is widely used. This apparatus is designed to sequentially move shot areas on a photosensitive substrate into the projection field of view (exposure field) of a projection optical system to position them and expose a reticle pattern image on each shot area.

FIG. 27 shows the main part of a conventional stepper. Referring to FIG. 27, a pattern image on a reticle 51 is projected/exposed on each shot area on a wafer 53, on which a photoresist is coated, via a projection optical system 52 with exposure light EL from an illumination optical system (not shown). The wafer 53 is held on a Z leveling stage 54. The Z leveling stage 54 is mounted on a wafer-side X-Y stage 55. The wafer-side X-Y stage 55 performs positioning of the wafer 53 within a plane (X-Y plane) perpendicular to an optical axis AX1 of the projection optical system 52. The Z leveling stage 54 sets the focus position (the position in a direction parallel to the optical axis AX1) of an exposure surface (e.g., an upper surface) of the wafer 53 and the inclination angle of the exposure surface in designated states.

A movable mirror 56 is fixed on the Z leveling stage 54. A laser beam from an external laser interferometer 57 is reflected by the movable mirror 56 so that the X- and Y-coordinates of the wafer-side X-Y stage 55 are constantly detected by the laser interferometer 57. These X- and Y-coordinates are supplied to a main control system 58. The main control system 58 controls the operations of the wafer-side X-Y stage 55 and the Z leveling stage 54 through a driving unit 59 so as to sequentially expose pattern images of the reticle 51 on the respective shot areas on the wafer 53 by the step-and-repeat scheme.

In this case, the pattern formation surface (reticle surface) on the reticle 51 and the exposure surface of the wafer 53 need to be conjugate to each other with respect to the projection optical system 52. However, the reticle surface does not vary much because of the high projection magnification and the large depth of focus. In general, therefore, an oblique incident type multi-point AF system is used to only detect whether the exposure surface of the wafer 53 coincides with the imaging plane of the projection optical system 52 within the range of the depth of focus (i.e., whether an in-focus state is achieved), thus controlling the focus position and inclination angle of the exposure surface of the wafer 53.

In the conventional multi-point AF system, illumination light with which the photoresist on the wafer 53 is not sensitized, unlike the exposure light EL, is guided from an illumination light source (not shown) via an optical fiber bundle 60. The illumination light emerging from the optical fiber bundle 60 is radiated on a pattern formation plate 62 via a condenser lens 61. The illumination light transmitted through the pattern formation plate 62 is projected on the exposure surface of the wafer 53 via a radiation objective lens 65. As a result, a pattern image on the pattern formation plate 62 is projected/formed on the exposure surface of the wafer 53 obliquely with respect to the optical axis AX1. The illumination light reflected by the wafer 53 is re-projected on the light-receiving surface of a light-receiving unit 69 via a focusing objective lens 66, a vibration plate 67, and an imaging lens 68. As a result, the pattern image on the pattern formation plate 62 is formed again on the light-receiving surface of the light-receiving unit 69. In this case, the main control system 58 vibrates the vibration plate 67 through a vibrating unit 70, and detection signals from a large number of light-receiving elements of the light-receiving unit 69 are supplied to a signal processing unit 71. The signal processing unit 71 supplies, to the main control system 58, a large number of focus signals obtained by performing synchronous detection of the detection signals in response to a driving signal from the vibrating unit 70.

FIG. 28B shows opening patterns formed on the pattern formation plate 62. As shown in FIG. 28B, nine slit-like opening patterns 72-1 to 72-9 are arranged on the pattern-formation plate 62 in a crisscross form. Since these opening patterns 72-1 to 72-9 are radiated on the exposure Surface of the wafer 53 from a direction crossing the X- and Y-axes at 45°, projection images AF1 to AF9 of the opening patterns 71-1 to 72-9 are arranged in the exposure field, of the projection optical system 52, formed on the exposure surface of the wafer 53 in the manner shown in FIG. 28A. Referring to FIG. 28A, a maximum exposure field 74 is formed to be inscribed to the circular illumination field of view of the projection optical system 52, and the projection images of the slit-like opening patterns are respectively projected on measurement points AF1 to AF9 on the central portion and the two diagonal lines in the maximum exposure field 74.

FIG. 28C shows a state of the light-receiving surface of the light-receiving unit 69. As shown in FIG. 28C, nine light-receiving elements 75-1 to 75-9 are arranged on the light-receiving surface of the light-receiving unit 69 in a crisscross form, and a light-shielding plate (not shown) having slit-like openings is arranged above the light-receiving elements 75-1 to 75-9. Images of the measurement points AF1 to AF9 in FIG. 28A are respectively formed again on the light-receiving elements 75-1 to 75-9 of the light-receiving unit 69. In this case, the illumination light reflected by the exposure surface of the wafer 53 in FIG. 27 is reflected by the vibration plate 67, which is present at the pupil position of the focusing objective lens 66 and also vibrates (rotates/vibrates) about an axis substantially perpendicular to the drawing surface of FIG. 27. For this reason, as shown in FIG. 28C, on the light-receiving unit 69, the positions of the projection images formed again on the light-receiving elements 75-1 to 75-9 vibrate in a direction RD as the widthwise direction of each slit-like opening.

In addition, since the images of the slit-like openings on the respective measurement points AF1 to AF9 are projected obliquely with respect to the optical axis of the projection optical system 52, when the focus position of the exposure surface of the wafer 53 changes, the re-formation position of the projection images on the light-receiving unit 69 changes in the direction RD. Therefore, by performing synchronous detection of the respective detection signals from the light-receiving elements 75-1 to 75-9 in response to the vibration signal from a vibration plate 67 in the signal processing unit 71, nine focus signals corresponding to the focus positions of the measurement points AF1 to AF9 can be obtained. The inclination angle and focus position of the exposure surface are obtained from these nine focus positions and are supplied to the main control system 58. The main control system 58 sets the focus position and inclination angle of the shot area on the wafer 53 to predetermined values through the driving unit 59 and the Z leveling stage 54. In this manner, in the stepper, each pattern image of the reticle 51 is exposed while the focus position and inclination angle of each shot area on the wafer 53 are aligned with the imaging plane of the projection optical system 52.

As described above, in the stepper, after each shot area on a wafer is positioned in the exposure field of the projection optical system, the focus position and inclination angle of the exposure surface of each shot area are detected by using the multi-point AF system, thus setting the entire exposure surface in the depth of focus of the projection optical system. For this reason, a long processing time is required for each shot area, resulting in a low throughput. As disclosed in U.S. Pat. No. 4,874,954, there is a method of eliminating such an inconvenience. In this method, while an X-Y stage is moved, focus positions are detected at predetermined points in a shot area which is to be exposed next on a wafer, and a Z leveling stage is finely moved to perform focusing with respect to the shot area. In the method, however, if a stepped portion is present in a shot area, it is difficult to perform accurate focusing with respect to the exposure surface (average plane) of the shot area. In addition, leveling of the shot area cannot be performed, and hence the entire surface cannot be set within the depth of focus of a projection optical system.

With a recent trend toward larger semiconductor elements, an increase in area of a pattern which can be transferred onto a wafer by one projection/exposure operation is required. Consequently, the field size of a projection optical system tends to increase. In addition, with a reduction in pattern size of a semiconductor element, a projection optical system is required to have a higher resolving power. It is, however, very difficult to realize both a broad field and a high resolving power. If, for example, an attempt is made to increase the resolving power while ensuring a field size equivalent to that in the prior art, the imaging performance (associated with distortion, curvature of field, and the like) cannot be maintained throughout the exposure field. Under the circumstances, in order to properly respond to the tendencies toward larger areas of transfer patterns and finer transfer patterns, a scan projection exposure apparatus has been reconsidered. This apparatus is designed to simultaneously scan a reticle and a wafer with respect to a projection optical system when a reticle pattern is projected/ exposed on the wafer.

As a conventional scan exposure apparatus, an apparatus having a one-to-one magnification type reflecting projection optical system is known. In this apparatus, a reticle stage for holding a reticle and a wafer stage for holding a wafer are coupled to a common movable column and are scanned/ exposed at the same speed. Since this one-to-one magnification type reflecting projection optical system uses no refracting element (lens), it exhibits a good chromatic aberration property throughout a wide exposure light wavelength range. The optical system simultaneously uses two or more line spectra (e.g., g- and h-rays) from a light source (mercury lamp) to increase the intensity of exposure light so as to allow a scan/exposure operation at a high speed. In the reflecting projection system, however, a point at which astigmatism values caused by both an S (sagittal) image plane and an M (meridional) image plane are made zero is limited to a position near an image height position separated from the optical axis of the reflecting projection system by a predetermined distance. For this reason, exposure light illuminating a reticle is shaped like a part of a narrow ring, a so-called arcuated slit.

As still another conventional scan exposure apparatus, an apparatus incorporating a refracting element is also known. In this apparatus, while the projecting magnification is increased or decreased by the reflecting element, both a reticle stage and a wafer stage are relatively scanned at a speed ratio corresponding to the projecting magnification. In this case, as a projection optical system, a system constituted by a combination of a reflecting element and a refracting element or a system constituted by only a refracting element is used. As an example of the reduction projection optical system constituted by a combination of a reflecting element and a refracting element, the system disclosed in U.S. Pat. No. 4,747,678 is available. U.S. Pat. No. 4,924,257 also discloses a method of performing step-and-scan exposure by using a reduction projection optical system capable of full field projection. In such a projection optical system incorporating a refracting element, exposure light illuminating a reticle has a rectangular or hexagonal shape.

In the scan exposure apparatus, similar to the stepper, exposure needs to be performed while an exposure surface of a wafer is aligned with the imaging plane of the projection optical system. For this reason, focusing and leveling may be performed by using the conventional multi-point AF system (FIG. 27) used by the stepper without any modification. In the conventional multi-point AF system, however, since measurement points are set in the exposure field of the projection optical system, focusing of a wafer may be made inaccurate owing to, e.g., the influence of a phase delay based on a signal processing time taken in the multi-point AF system. More specifically, in the scan exposure apparatus, a wafer is scanned with respect to the exposure field of the projection optical system. Even if, therefore, the wafer is finely moved along the optical axis of the projection optical system on the basis of focus positions detected at the respective measurement points in the exposure field, the wafer has already been moved by a predetermined distance at this time, and focusing cannot be always performed accurately. In order to prevent this, the moving speed of the wafer stage during a scan/exposure operation may be decreased. In this method, however, the exposure time required for each shot area is prolonged to cause a great reduction in throughput. In addition, in a leveling operation, similar to a focusing operation, leveling of the wafer is made inaccurate owing to the influence of a phase delay based on a signal processing time and the like.

SUMMARY OF THE INVENTION

It is an object of the present invention to provide an exposure method and apparatus which can align an exposure surface of a photosensitive substrate with a predetermined reference plane with high precision at high speed.

First, the present invention is suitable for a step-and-repeat projection exposure apparatus for sequentially transferring a mask pattern on each of a plurality of shot areas on a photosensitive substrate, which apparatus includes a projection optical system for projecting the mask pattern on the photosensitive substrate, and a substrate stage for holding the photosensitive substrate, two-dimensionally moving it within a plane perpendicular to the optical axis of the projection optical system, and also moving it along the optical axis.

The first apparatus of the present invention comprises position detection means for forming a pattern image having a predetermined shape on a photosensitive substrate and photoelectrically detecting light reflected by the photosensitive substrate to detect a position at each of a plurality of points on the photosensitive substrate along an optical axis of the projection optical system, thereby making an exposure surface of each shot area on the photosensitive substrate accurately coincide with an imaging plane of the projection optical system, calculation means for calculating an offset amount between the imaging plane of the projection optical system and an exposure surface of a next shot area, on which a pattern of the mask is to be transferred, along the optical axis on the basis of a detection signal output from the position detection means when each of a plurality of measurement points in the next shot area coincides with or approaches the pattern image having the predetermined shape, and control means for controlling movement of a substrate stage to reduce the calculated offset amount to substantially zero.

As described above, in the first apparatus, since a height position at each of a plurality of measurement points in an area, on a photosensitive substrate, which is to be exposed next, during movement of the substrate stage, focusing and leveling can be performed during movement of the substrate stage or immediately after the movement. This allows a great increase in throughput. In this case, even if there is a stepped portion in a shot area, no deterioration in focusing and leveling precision occurs.

Second, the present invention is suitable for a scan type projection exposure apparatus including a projection optical system for projecting a mask pattern on a photosensitive substrate, a mask stage capable of moving in a direction perpendicular to the optical axis of the projection optical system while holding a mask, and a substrate stage capable of two-dimensionally moving within a plane perpendicular to the optical axis of the projection optical system and also capable of moving along the optical axis while holding the photosensitive substrate. This apparatus is designed to transfer a mask pattern on each shot area on the photosensitive substrate by relatively scanning the mask stage and the substrate stage at a speed ratio corresponding to the magnification of the projection optical system.

The second apparatus of the present invention includes position detection means for forming a pattern image having a predetermined shape on a photosensitive substrate and photoelectrically detecting light reflected by the photosensitive substrate to detect a position at each of a plurality of points on the photosensitive substrate along an optical axis of a projection optical system, the position detection means having at least one measurement point at each of two sides of an exposure area (i.e., an area which is conjugate to an illumination area of exposure light incident on a reticle with respect to the projection optical system and corresponds to a projection area on which a reticle pattern is to be projected by the projection optical system) of the projection optical system in the relative scan direction of the mask and the photosensitive substrate, and control means for controlling movement of a substrate stage on the basis of detection signals sequentially output from the position detection means, during relative scan of the mask and the photosensitive substrate, such that partial areas, of a shot area on the photosensitive substrate, which are located inside the exposure area of the projection optical system continuously coincide with an imaging plane of said projection optical system.

As described above, in the second apparatus, a position at a predetermined point in a shot area on a photosensitive substrate along the optical axis of the projection optical system can be detected, before the shot area enters the exposure area of the projection optical system, by at least one measurement point set on each of the two sides of the exposure area. Therefore, during a scan/exposure operation, an exposure surface of the photosensitive substrate in the exposure area of the projection optical system can be accurately aligned with the imaging plane of the projection optical system.

In the first method of the present invention which is suitable for a scan exposure apparatus, after synchronous scan of a mask and a photosensitive substrate is started, a difference between a height position of a shot area, on the photosensitive substrate, which is separated from an exposure area of a projection optical system by a predetermined distance in a direction opposite to a scan direction, and a height position of an imaging plane of the projection optical system is detected. In addition, a height position set by a substrate stage on which the photosensitive substrate is placed is detected. When the shot area reaches the exposure area of the projection optical system, a height set by the substrate stage is set to a height obtained by adding the detected difference to the detected height, thereby accurately aligning the shot area with the imaging plane of the projection optical system.

In the second method of the present invention which is suitable for a scan exposure apparatus, after synchronous scan of a mask and a photosensitive substrate is started, a difference between an inclination amount of a shot area, on the photosensitive substrate, which is separated from an exposure area of a projection optical system by a predetermined distance in a direction opposite to a scan direction, and an inclination amount of an imaging plane of the projection optical system is detected. In addition, an inclination amount set by a substrate stage on which the photosensitive substrate is placed is detected. When the shot area reaches the exposure area of the projection optical system, an inclination amount set by the substrate stage is set to an inclination amount obtained by adding the detected difference to the detected inclination amount, thereby accurately aligning the shot area with the imaging plane of the projection optical system in a parallel manner.

According to the first method of the present invention, the height of a photosensitive substrate is detected by the position detection means at a place separated from the exposure area of the projection optical system by a distance determined by a phase delay based on a signal processing time taken by the position detection means and the feed speed of a substrate stage. Focusing based on the detected height of the shot area on the photosensitive substrate is performed when the shot area moves into the exposure area. The phase difference and the like caused by the position detection means and the like can be canceled by the time difference between these operations, thereby realizing accurate focusing.

According to the second method of the present invention, the inclination angle of the photosensitive substrate is detected by the inclination angle detection means at a place separated from the exposure area of the projection optical system by a distance determined by a phase difference based on a signal processing time taken by the inclination angle detection means and the feed speed of a substrate stage. Leveling based on the detected inclination angle of a shot area on the photosensitive substrate is performed when the shot area moves into the exposure area. The phase delay and the like of the inclination angle detection means and the like can be canceled by the time difference between these operations, thereby realizing accurate leveling.

The third apparatus of the present invention which is suitable for a scan exposure apparatus includes multi-point measurement means for measuring a height position of a photosensitive substrate, along an optical axis of a projection optical system, at each of a plurality of measurement points set in a direction perpendicular to a scan direction of the photosensitive substrate, and calculation means for obtaining a difference between an inclination angle of an exposure surface of the photosensitive substrate and that of an imaging surface of the projection optical system on the basis of a measurement result obtained by the multi-point measurement means. The apparatus further includes an inclination setting stage, arranged on a substrate stage, for setting an inclination angle in the scan direction (Y direction) of the photosensitive substrate and an inclination angle in a direction (X direction) perpendicular to the scan direction on the basis of the inclination angle difference obtained by the calculation means, and response speeds at which the inclination setting stage set inclination angles $\theta_Y$ and $\theta_X$ in the scan direction (Y direction) of the photosensitive substrate and the direction (X direction) perpendicular to the scan direction are set to be different from each other.

In this case, the multi-point measurement means may sample the height of the photosensitive substrate at each of the plurality of measurement points with reference to the position of the substrate stage when the photosensitive substrate is scanned through the substrate stage.

In addition, the multi-point measurement means may measure the height of the photosensitive substrate at each of a plurality of measurement points constituted by a plurality of points in an area (the exposure area of the projection optical system) conjugate to an illumination area of exposure light incident on the mask with respect to the projection optical system and a plurality of points in an area located in the upstream of the exposure area when the photosensitive substrate is scanned.

Furthermore, it is preferable that the multi-point measurement means changes the positions of the plurality of measurement points in the process of sequentially exposing a mask pattern on one shot area on the photosensitive substrate.

The fourth apparatus of the present invention which is suitable for a scan exposure apparatus includes height measurement means for measuring heights of a photosensitive substrate, along an optical axis of a projection optical system, at predetermined measurement points in an exposure area of a projection optical system and a measurement area constituted by an area located in the upstream of the exposure area when the photosensitive substrate is scanned, calculation means for obtaining a difference between an average height of an exposure surface of the photosensitive substrate and a height of an imaging plane of the projection optical system on the basis of maximum and minimum values of a plurality of height measurement results obtained by the height measurement means when the photosensitive substrate is scanned, and a height setting stage, arranged on a substrate stage, for setting a height of the photosensitive substrate on the basis of the height difference obtained by the calculation means.

In the third apparatus of the present invention, when a mask and a photosensitive substrate are synchronously scanned to expose a pattern image of the mask on the photosensitive substrate, the height of the photosensitive substrate is measured at a plurality of measurement points including an upstream measurement point in the scan direction by using the multi-point measurement means. By obtaining height information at the plurality of measurement points, a number of times, along the scan direction, the inclination angle of the photosensitive substrate is obtained. Thereafter, when a pattern image of the mask is to be exposed on an area whose inclination angle is obtained in this manner, the inclination angle of the area is set on the basis of the inclination angle obtained in advance. With this operation, even in the slit scan exposure scheme, the exposure surface of the photosensitive substrate is set to be parallel to the imaging plane of the projection optical system.

In the third apparatus, when such leveling is to be performed, the response speed for leveling in the scan direction is different from that for leveling in the non-scan direction. In order to explain the function and effect based on this arrangement, error factors in focusing and leveling in a scan exposure operation will be described. In a scan exposure apparatus, the following errors can be considered.

① Focus Offset Error and Vibration Error

A focus offset error is a difference in focus position between an average plane of an exposure surface and the imaging plane of the projection optical system. A vibration error is an error caused by vibrations and the like in the focusing direction of the substrate stage in a scan/exposure operation. Such errors will be described in detail below with reference to a case wherein only autofocus control is performed, a case wherein batch exposure is performed as in the case of a stepper, and a case wherein exposure is performed by a scan scheme.

FIG. 21A shows a case wherein batch exposure is performed. FIG. 21B shows a case wherein exposure is performed by the scan scheme. Referring to FIG. 21A, an average plane 34 of an exposure surface 5a of a photosensitive substrate coincides with the imaging plane of a projection optical system, but focus positions at positions Ya, Yb, and Yc are different from the constant average plane 34 by $-\Delta Z1$, 0, and $\Delta Z2$, respectively. That is, focus offset amounts at the positions Ya and Yb are $-\Delta Z1$ and $\Delta Z2$, respectively.

In the case shown in FIG. 21B, a series of partial average planes 35A, 35B, 35C, . . . on the exposure surface 5a are sequentially aligned with the imaging plane of the projection optical system in the scan direction. Therefore, focus offset errors at the positions Ya, Yb, and Yc become 0 owing to an averaging effect. However, when an image is to be formed at the position Yb, the focus position moves from the average plane 35B to the average plane 35D by a distance corresponding to a height $\Delta ZB$. As a result, the image at the position Yb has a variation of $\Delta ZB$ in the focusing direction. Similarly, images formed at the positions Ya and Yc respectively have variations of $\Delta ZA$ and $\Delta ZB$ in the focusing direction.

That is, in the scan scheme, although a focus offset error becomes almost 0 with respect to an uneven portion on the photosensitive substrate surface of a predetermined frequency or less, new errors (vibration errors) are caused by rolling or pitching of a substrate stage, vibrations in the focusing direction (Z-axis direction), error components caused when an autofocus mechanism and an auto-leveling mechanism follow up low-frequency air fluctuation errors, short-term wavelength variations of exposure light (KrF excimer laser or the like), and the like.

② Focus Follow-up Errors, Air Fluctuation Errors, and Stage Vibration Errors

These errors are typical examples of the vibration errors mentioned in ①, which errors are dependent on the response frequencies of the autofocus mechanism and the auto-leveling mechanism and can be classified into the following errors:

(1) a high-frequency stage vibration error which cannot be controlled by a control system, a short-term wavelength variation error of exposure light (KrF excimer laser or the like), and the like;

(2) of air fluctuation errors, a low-frequency air fluctuation error and the like that the substrate stages follows up; and (3) a measurement error and the like which are not considered as focus errors because the substrate stage does not follow up them, although they are included in measurement results obtained by a focus position detection system or an inclination angle detection system.

③ Errors Caused by Uneven Portion on Exposure Surface of Photosensitive Substrate These errors are caused because the exposure field of the projection optical system is a two-dimensional unit plane, and measurement of focus positions with respect to an exposure surface of a photosensitive substrate is performed at an finite number of measurement points in a scan/exposure operation. The errors can be classified into two types of errors as follows:

(1) an offset error between a surface 36A to be positioned (focus plane) and an ideal focus plane, which error is based on a method of calculating the positions of measurement points when the focus plane 36A and a focus plane 36B are obtained by measuring focus positions at multiple points on the exposure surface 5a of the photosensitive substrate, as shown in FIGS. 22A and 22B; and (2) an error caused by the difference between the scan speed and the follow-up speeds of the autofocus mechanism and the auto-leveling mechanism, the response speed of the focus position detection system, and the like.

In this case, the response speed (focus response) at which a focus position is aligned with the imaging plane of the projection optical system is determined by the time delay error shown in FIG. 22C and the servo gain shown in FIG. 22D. Referring to FIG. 22C, a curve 37A represents a focusing-direction driving signal (target focus position signal) for aligning a series of partial areas of the exposure surface 5a of the photosensitive substrate with the imaging plane of the projection optical system, and a curve 38A represents a signal (follow-up focus position signal) obtained by converting the moving amounts of the series of partial areas of the exposure surface 5a in the focusing direction into a driving signal. The curve 38A is delayed with respect to the curve 37A by a predetermined period of time. Similarly, referring to FIG. 22D, a curve 37B represents a target focus position signal for the series of partial areas of the exposure surface 5a of the photosensitive substrate, and a curve 38B represents a follow-up focus position signal for the series of partial areas of the exposure surface 5a. The amplitude (servo gain) of the curve 38B is smaller than that of the curve 37B by a predetermined amount.

In the third apparatus of the present invention, in order to remove these errors, the response characteristic of the leveling mechanism in the scan direction is set to be different from that in the non-scan direction. As a multi-point measurement system for the auto-leveling mechanism in the present invention, an oblique incident type multi-point focus detection system is assumed. It is an object of the present invention not to consider an average plane of an exposure surface of a photosensitive substrate in a predetermined area in the exposure field of the projection optical system but to minimize the maximum value of offsets between the respective points on an exposure surface and the imaging plane of the projection optical system in the predetermined area. When the maximum value of offsets between almost all the points on an exposure surface of the photosensitive substrate and the imaging plane of the projection optical system is minimized in a predetermined area in the exposure field of the projection optical system, this exposure field is called a "good field".

Assume that there are a large number of focus position measurement points (not shown) in a slit-like exposure area 24 conjugate to an illumination area of exposure light incident on a mask with respect to the projection optical system, as shown in FIG. 23.

Referring to FIG. 23, assuming that one shot area $SA_{ij}$ on a photosensitive substrate is scanned with respect to the exposure area 24 in the Y direction at a speed $V/\beta$, the width of the shot area $SA_{ij}$ in the scan direction is represented by WY; the width in the non-scan direction, WX; and the width of the exposure area 24 in the scan direction, D. Focus positions at a large number of measurement points in a central area 24a in the exposure area 24 are averaged to obtain a focus position of an average plane at the central point of the exposure area 24. In addition, an inclination angle $\theta_Y$ of the average plane in the scan direction is obtained by, e.g., least square approximation on the basis of focus positions at the measurement points in measurement areas 24b and 24c on two sides of the exposure area 24 in the scan direction. Furthermore, an inclination angle $\theta_X$ of the average plane in the non-scan direction is obtained by, e.g., least square approximation on the basis of focus positions at the measurement points in the measurement areas 24b and 24c on two sides of the exposure area 24 in the non-scan direction. Letting fm [Hz] be the response frequency of leveling in the scan direction, and fn [Hz] be the response frequency of leveling in the non-scan direction, the values of fm and fn are independently set.

The period of periodic curving of the shot area $SA_{ij}$ on the photosensitive substrate in the scan direction is represented by a curving parameter F as a ratio with respect to the width WY in the scan direction (a similar curving period is set in the non-scan direction). A focus error at each measurement point in the exposure area 24 with such periodic curving is represented by the sum of the absolute value of the average of focus errors in a scan operation and 1/3 the amplitude of the amplitude of each focus error in the scan operation. In addition, the amplitude of the periodic curving of the curving parameter F is normalized to 1, and an error parameter S exhibiting the maximum value of the focus errors at the respective measurement points when the curving parameter is represented by F is represented by a ratio with respect to the curving parameter F. That is, the following equations can be established:

F=period of curving/WY (1)

S=maximum value of focus errors/F (2)

FIG. 24A shows the error parameter S with respect to the curving parameter F in a case wherein the response frequency fm of leveling in the scan direction is equal to the response frequency fn of leveling in the non-scan direction, and both the frequencies are high. Referring to FIG. 24A, a curve A1 represents the error parameter in the non-scan direction; a curve B1, the absolute value of the average of ordinary focus errors in the error parameter S in the non-scan direction; a curve A2, the error parameter S in the scan direction; and a curve B2, the absolute value of the average of ordinary focus errors in the error parameter S in the scan direction. The curves A1 and A2 represent more realistic focus errors. When the value of the curving parameter F is small, and the period of uneven portions on an exposure surface is short, the follow-up property of leveling control in the scan direction is poor (curve A2). As the period of uneven portions increases, leveling control in the scan direction follows up curving. Since no sequential change in focus position occurs in the non-scan direction unlike the scan direction, even if the curving period increases in the non-scan direction, the follow-up property (curve A1) is poorer than that in the scan direction. As described above, a focus error is preferably set such that the parameter S becomes 0.5 or less. However, overall focus errors in both the scan direction and the non-scan direction are large.

FIG. 24B shows the error parameter S with respect to the parameter F in a case wherein the response frequency fm of leveling in the scan direction is set to be higher than the response frequency fn of leveling in the non-scan direction, and both the response frequencies fm and fn are low. Referring to FIG. 24B, a curve A3 represents the error parameter S in the non-scan direction; a curve B3, the absolute value of the average of ordinary focus errors in the non-scan direction; a curve A4, the error parameter S in the scan direction; and a curve B4, the absolute value of the average of ordinary focus errors in the scan direction. As is apparent from the comparison between FIGS. 24A and 24B, the error parameter S is closer to 0.5 and the focus error is smaller in the case of low response frequencies (FIG. 24B) than in the case of almost perfect response (FIG. 24A). This is because when the auto-leveling mechanism follows up fine uneven portions on the photosensitive substrate, a deterioration in precision occurs in the slit-like exposure area 24. Note that if the response frequencies are set to be too low, the leveling mechanism cannot follow up even low-frequency uneven portions. Therefore, the response frequencies must be set to be proper values.

In the case shown in FIG. 24B, the response frequency fm of leveling in the scan direction is set to be higher than the response frequency fn of leveling in the non-scan direction for the following reason. The period of uneven portions with the parameter F becomes substantially shorter in the scan direction than in the non-scan direction in accordance with the slit width. Therefore, in order to proper follow up uneven portions on an exposure surface, the response frequency in the scan direction needs to be higher than that in the non-scan direction.

When the multi-point measurement means for the auto-leveling mechanism is to measure the height of a photosensitive substrate at a plurality of measurement points constituted by a plurality of points in an exposure area (24) of the projection optical system and a plurality of points in an area located in the upstream of the exposure area when the photosensitive substrate is scanned, focus positions at measurement points in the area in the upstream of the exposure area are pre-read. This operation is called a "split pre-read" operation. In this method, the length (approach distance) by which focus positions are read by the multi-point measurement means before exposure is reduced, as compared with the method of pre-reading all the measurement points (a complete pre-read operation).

When the multi-point measurement means sequentially changes the positions of a plurality of measurement points in the process of exposing a mask pattern on one shot area on a photosensitive substrate, for example, a split pre-read operation is performed at an end portion of the shot area, and a complete pre-read operation is performed at a central portion and the subsequent portion of the shot area, while an exposure position detecting section checks the results by open loop control. With this operation, while the leveling precision is kept high, the approach distance at the end portion of each shot area can be reduced to increase the throughput.

Next, consider autofocus control in the fourth apparatus of the present invention. According to the concept of the above-mentioned good field, as shown in FIG. 23, if the focus positions at the respective measurement points in the central portion 24a of the exposure area 24 are averaged, and the plane represented by the average of the focus positions is aligned with the imaging plane of the projection optical system, a deterioration in precision may occur. FIG. 25A shows a plane 34A corresponding to the average of the focus positions at the respective measurement points on an exposure surface 5a, of a photosensitive substrate, which has an uneven portion having a height H. A difference $\Delta Z3$ between the plane 34A and the uneven portion in the focusing direction is larger than H/2.

In contrast to this, in the fourth apparatus of the present invention, the maximum and minimum values of the focus positions at the respective measurement points in a predetermined measurement area on the exposure surface 5a are obtained, and a plane corresponding to the intermediate focus position between the maximum and minimum values is aligned with the imaging plane of the projection optical system.

FIG. 25B shows a plane 34B corresponding to the intermediate focus position between a maximum value $Z_{max}$ and a minimum value $Z_{min}$ of the focus positions at the respective measurement points on the exposure surface 5a, of the photosensitive substrate, which has an uneven portion having a height H. A focus position $Z_{34B}$ of the plane 34B can be expressed as follows:

$$Z_{34B}=(Z_{max}+Z_{min})/2 \qquad (3)$$

Subsequently, the plane 34B is aligned with the imaging plane of the projection optical system. Both a difference $\Delta Z4$ between the plane 34B and the exposure surface 5a in the focusing direction, and a difference $\Delta Z5$ between the plane 34B and the uneven portion in the focusing direction are almost H/2. That is, the maximum value of focus position errors at the respective points on the exposure surface 5a is smaller on the plane 34B in FIG. 25B than that on the plane 34A in FIG. 25A. According to the concept of the good field, therefore, an exposure surface of a photosensitive substrate can be more accurately aligned with the imaging plane of the projection optical system by the present invention.

FIGS. 26A and 26B respectively show the characteristics of the error parameters S with respect to the curving parameters F in cases wherein the response frequency fm of leveling in the scan direction is set to be equal to the response frequency fn in leveling in the non-scan direction, and the two frequencies are set to be high, as in the case shown in FIG. 24A, while autofocus control based on the averaging process shown in FIG. 25A, and autofocus control based on the average of the maximum and minimum values shown in FIG. 25B are respectively performed, Referring to FIG. 26A showing the case based on the averaging process, curves A5 and B5 respectively represent the error parameters S in the non-scan direction; and curves A6 and B6, the error parameters S in the scan direction. Referring to FIG. 26B showing the case based on the average of maximum and minimum values, curves A7 and B7 respectively represent the error parameters S in the non-scan direction; and curves A8 and B8, the error parameters S in the scan direction.

As is apparent from FIG. 26B, when autofocus control is performed on the basis of the average value of maximum and minimum values, the value of the error parameter S is close to 0.5 with respect to all the curving parameters F, i.e., all the frequency bands, and the maximum value of focus errors is .smaller than that in the case wherein autofocus control is performed on the basis of an averaging process.

Referring to FIGS. 22A and 22B again, consider a case wherein autofocus control is performed on the basis of the average of the maximum and minimum values of focus positions obtained at the respective measurement points in a predetermined measurement area. As shown in FIG. 22A, a plane 36A defined by a focus position difference $\Delta Za$ with respect to the maximum value of focus positions of an exposure surface 5a having a curve with an amplitude $2 \cdot \Delta Za$ is aligned with the imaging plane of the projection optical system. Assume that autofocus control is simply performed with respect to the exposure surface having the curve with the amplitude $2 \cdot \Delta Za$ on the basis of the average of the focus positions obtained at the respective measurement points, and auto-leveling control is performed on the basis of least square approximation of the obtained focus positions. In this case, as shown in FIG. 22B, a plane 36B defined by a focus position error $\Delta Zb$ ($>\Delta Za$) with respect to the maximum value within the range of an amplitude $\Delta Zc$ ($>2 \cdot \Delta Za$) is aligned with the imaging plane of the projection optical system in some case. Therefore, a focus error in autofocus control based on the average of the maximum and minimum values of obtained focus positions is smaller than that in autofocus control based on an averaging process, regardless of whether the auto-leveling mechanism is used or not.

In the present invention, control is performed such that a plane defined by (the maximum value $Z_{max}$ of focus positions + the minimum value $Z_{min}$ of the focus positions)/2 is aligned with the imaging plane. However, the depth of focus of either a projection or a recess of an exposure surface 5a of a photosensitive substrate may be required depending on a device process. Therefore, control is preferably performed such that a plane at a focus position $Z_{MN}$ defined by a proportional distribution represented by the following equation using predetermined coefficients M and N is aligned with the imaging plane:

$$Z_{MN}=(M \cdot Z_{max}+N \cdot Z_{min})/(M+N) \qquad (4)$$

BRIEF DESCRIPTION OF THE DRAWINGS

FIG. 7 is a flow chart showing an exposure operation of the second embodiment;

FIGS. 13A and 13B are views for explaining a method of correcting each focus position measurement value;

FIG. 14A is a graph showing a transfer function obtained when a response frequency ν is 10 Hz, and FIG. 14B is a graph showing a position function obtained by inverse Fourier transform of the transfer function in FIG. 14A;

FIG. 15A is a view showing the trace of a wafer in a case wherein exposure is performed with respect to an adjacent shot area, FIG. 15B is a timing chart showing a reticle scan operation, and FIG. 15C is a timing chart showing a wafer scan operation;

DESCRIPTION OF THE PREFERRED EMBODIMENTS

Figure 1:
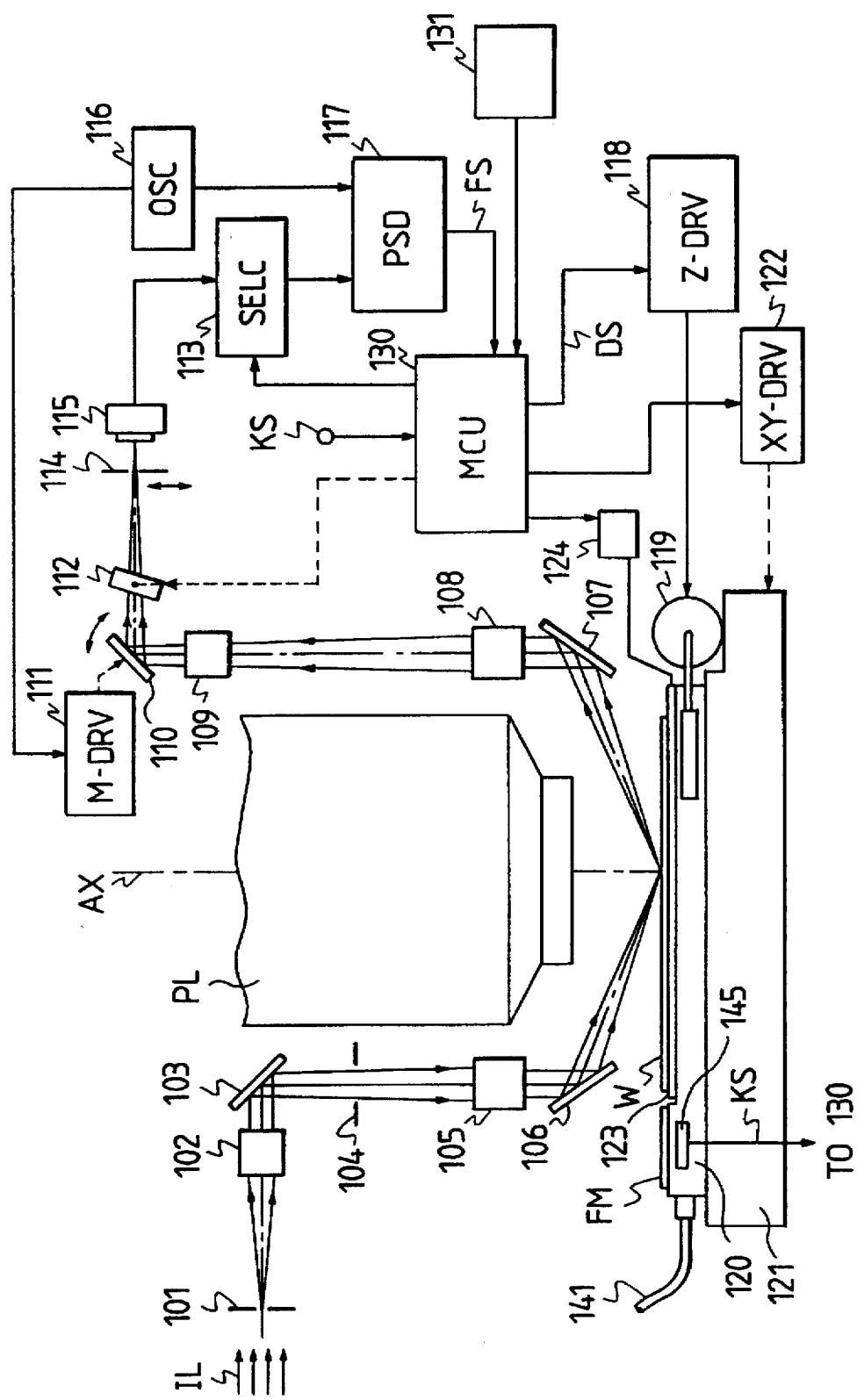
FIG. 1 is a block diagram showing part of the arrangement of a projection exposure apparatus according to the first embodiment of the present invention.

FIG. 1 shows part of the arrangement of a projection exposure apparatus of a step-and-repeat scheme, which has an oblique incident type AF (autofocus) system according to the first embodiment of the present invention.

The AF system (101 to 115) shown in FIG. 1 is a multi-point AF system, in which measurement points at which positional offsets (so-called focus errors) of a wafer W along the optical axis are measured are set at a plurality of positions in the projection field of view of a projection lens PL.

Referring FIG. 1, the slit plate 101 is illuminated with illumination light IL with which a resist coated on the wafer W is not sensitized. Light transmitted through a slit formed in the slit plate 101 is obliquely incident on the wafer W via a lens system 102, a mirror 103, a stop 104, a light-emitting objective lens 105, and a mirror 106. Note that a halogen lamp or the like is used as a light source.

If the surface of the wafer W is at an optimal imaging plane Fo, i.e., the best focus position of the projection lens PL, an image of the slit of the slit plate 101 is formed on the surface of the wafer W by the lens system 102 and the light-emitting objective lens 105. The angle defined between the optical axis of the light-emitting objective lens 105, reflected by the mirror 106, and the wafer surface is set to be about 5° to 12°. The center of the image of the slit of the slit plate 101 is set at a position where an optical axis AX of the projection lens PL crosses the surface of the wafer W.

The slit image light beam reflected by the wafer W is formed on a light-receiving slit plate 114 again via a mirror 107, a light-receiving objective lens 108, a lens system 109, a vibration mirror 110, and a plane parallel 112. A vibration mirror 110 finely vibrates the slit image formed on the light-receiving slit plate 114 in a direction perpendicular to the longitudinal direction of the slit image.

The plane parallel 112 shifts the correlation between the slit of the light-receiving slit plate 114 and the vibration center of the slit image reflected by the wafer W, in a direction perpendicular to the slit longitudinal direction. In addition, the vibration mirror 110 is vibrated by a mirror driving section (M-DRV) 111 driven by a driving signal output from an oscillator (OSC) 116.

When the slit image is vibrated on the light-receiving slit plate 114, a light beam transmitted through the slit of the light-receiving slit plate 114 is received by an array sensor 115. The array sensor 115 is formed by arranging independent photoelectric cells in small areas divided in the longitudinal direction of the slit of the light-receiving slit plate 114. As this array sensor, a silicon photodiode, a phototransistor, or the like can be used.

A signal from each light-receiving cell of the array sensor 115 is input to a synchronous detection circuit (PSD) 117 via a selector circuit 113. The PSD 117 receives an AC signal having the same phase as that of a driving signal from the OSC 116 and performs synchronous rectification with reference to the phase of the AC signal.

The PSD 117 comprises a plurality of detection circuits for separately performing synchronous detection of output signals from a plurality of light-receiving cells selected from the array sensor 115. Each detection output signal FS is called an S curve signal, which is set at zero level when the slit center of the light-receiving slit plate 114 coincides with the vibration center of the slit image reflected by the wafer W; is set at positive level when the wafer W is displaced above zero level; and is set at negative level when the wafer W is displaced below zero level. Therefore, the height position of the wafer W at which the output signal FS is set at zero level is detected as an in-focus position.

In such an oblique incident scheme, there is no guarantee that the height position of the wafer W detected as an in-focus point (at which the output signal FS is at zero level) always coincides with the optimal imaging plane Fo. That is, in the oblique incident scheme, the system has a virtual reference plane determined by the system itself, and the output signal FS from the PSD is set at zero level when the surface of the wafer W coincides with the reference plane. Although the reference plane is set to coincide with the optimal imaging plane Fo as accurately as possible in the process of manufacturing the apparatus, it is not guaranteed that these planes are kept coinciding with each other for a long period of time. For this reason, the virtual reference plane can be displaced in the direction of the optical axis AX by inclining the plane parallel 112 in FIG. 1 so as to be made to coincide with the optimal imaging plane Fo, i.e., to perform calibration.

Referring to FIG. 1, for example, an MCU 130 has the following functions: receiving an output signal KS from a photoelectric sensor 145 to calibrate the oblique incident type multi-point AF systems; setting the inclination of the plane parallel 112; outputting a command signal DS to a circuit (Z-DRV) 118 for driving a driving motor 119 of a Z stage 120 on the basis of output signals FS from the multi-point AF systems; and outputting a command signal to a driving section 122 (including a motor and its control circuit) for driving an X-Y stage 121.

Referring to FIG. 1, a leveling stage 123 is mounted on the Z stage 120, and the MCU 130 also has a function of outputting a command signal to a leveling stage driving section 124 (including a motor and its control circuit) for driving the leveling stage 123. By properly driving the leveling stage 123, the overall wafer surface can be inclined by a desired amount.

A fiducial mark FM for obtaining the optimal imaging plane Fo is formed on the Z stage 120. A plurality of slit-like opening portions are formed in the surface of the fiducial mark FM. The fiducial mark FM is illuminated with light having almost the same wavelength as that of exposure light, from below (from the Z stage side), via a fiber 141. The height of the surface of the fiducial mark FM is set to almost coincide with the height of the surface of the wafer W. Light transmitted through each slit-like opening of the fiducial mark FM is reflected by a reticle (mask) (not shown) via the projection lens PL and is incident on the photoelectric sensor 145, arranged below the opening portions, via the opening portions. The Z stage 120, i.e., the surface of the fiducial mark FM, is moved in the direction of height (the direction of the optical axis AX) so that the position of the surface of the fiducial mark FM at which the contrast of the light received by the photoelectric sensor 145 is maximized (i.e., the voltage value of the output signal KS reaches its peak) coincides with the optimal imaging plane (best focus position) Fo. Therefore, the optimal imaging plane of the projection lens PL can be obtained by repeating the above-described measurement upon positioning the fiducial mark FM to each of a plurality of points in the projection field of view of the projection lens PL (for example, these points may be made coincide with a plurality of measurement points of the multi-point AF systems).

Figure 2:
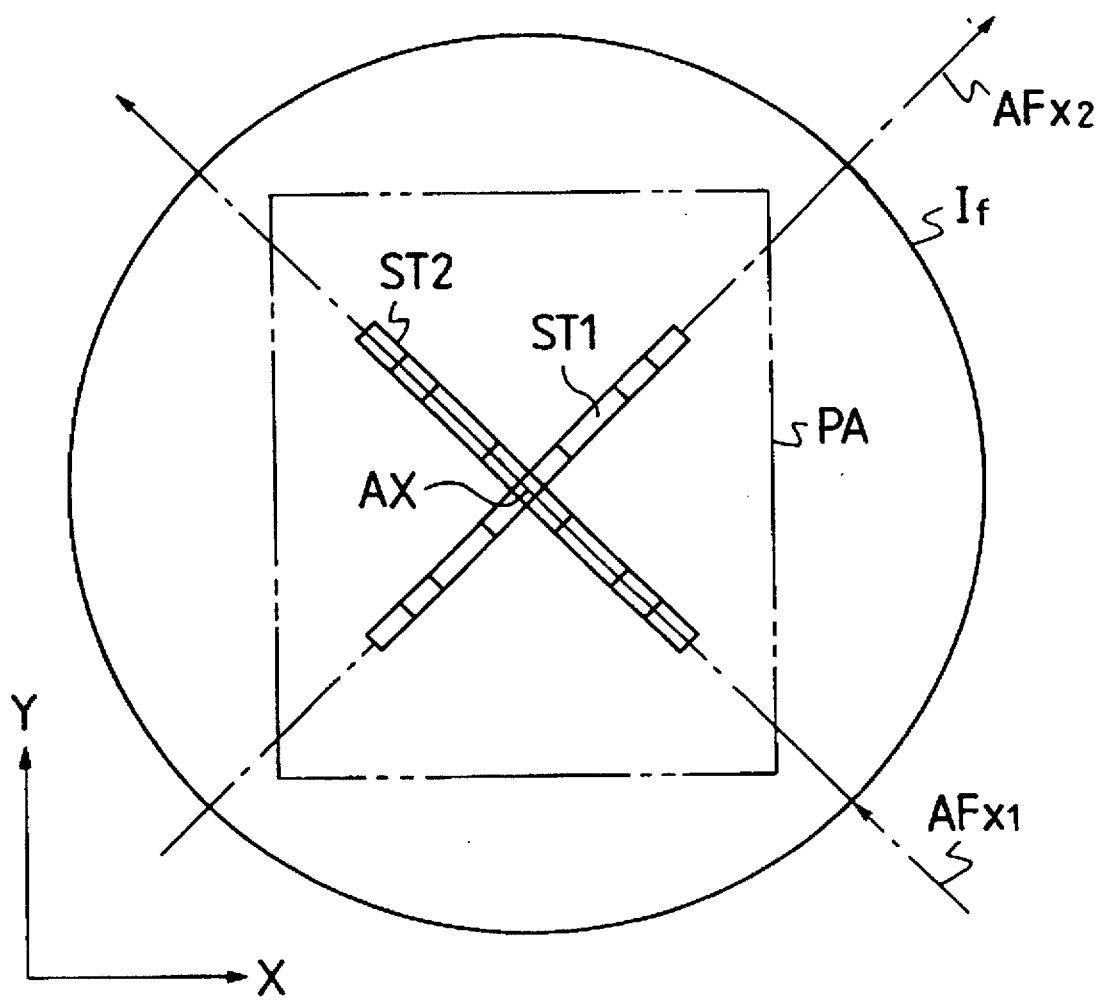
FIG. 2 is a view showing the positional relationship between the projection field of view of a projection optical system and pattern images formed by multi-point AF systems.

FIG. 2 shows the positional relationship between a projection field of view If of the projection lens PL and a projection slit image ST of the AF system with reference to the surface of the wafer W. In general, the projection field of view If has a circular shape, and a pattern area PA of a reticle has a rectangular shaped enclosed with this circular shape.

The slit image ST is formed, on the wafer, as two intersecting slit images ST1 and ST2 which are inclined at about 45° with respect to the moving coordinate axes X and Y of the X-Y stage 121, respectively. The slit images ST1 and ST2 are respectively formed by a pair of oblique incident type multi-point AF systems, each identical to the one described above. Therefore, a common optical axis AFx1 of a light-emitting objective lens 105 and a light-receiving objective lens 108 of one AF system extends on the wafer surface in a direction perpendicular to the slit image ST1, whereas a common optical axis AFx2 of a light-emitting objective lens 105 and a light-receiving objective lens 108 of the other AF system extends on the wafer surface in a direction perpendicular to the slit image ST2.

In addition, the center of each of the slit images ST1 and ST2 is set to substantially coincide with the optical axis AX.

A circuit pattern to be superposed on a pattern image has already been formed on a shot area, on the wafer W, on which a pattern is projected/exposed. The surface of a wafer for a stack type memory IC or the like has large stepped portions to achieve a high integration. In addition, in a shot area, a change of an uneven portion becomes more conspicuous after each process of manufacturing a device, so that a large change of an uneven portion may occur in the longitudinal direction of the slit image ST. For this reason, this apparatus is designed to form the slit image ST as long as possible within the projection area of the pattern area PA, i.e., to uniformly and entirely cover the pattern area PA.

In this embodiment, each slit image is divided into five portions to set the five measurement points shown in FIG. 2. The manners of arranging slit images, dividing each slit image, setting measurement points at specific divided portions, and setting the measurement points at specific positions of the divided portions are dependent on the following conditions: a pattern to be exposed, the number and arrangement of chips to be exposed in one exposure operation, stepped portions formed before exposure, and the like. All these conditions are known before each projection/exposure process, i.e., conditions associated with design items which can be changed.

The operation of the projection exposure apparatus of the embodiment, which has the above-described arrangement, will be described below.

Information about the target position of the X-Y stage 121 in the next exposure operation, information about desired measurement point positions in an area to be exposed next, and the like are input from a host computer (or operator) to the MCU 130 through an input means 131. During movement to the next shot area, the MCU 130 determines a specific measurement point, of the desired measurement points in the next shot area, which passes through a pattern image to allow measurement during the movement, on the basis of the following information: the current position of the X-Y stage 121, the next target position for positioning, the corresponding position of each light-receiving cell of the array sensor 115 on a photosensitive substrate, i.e., the height measurement enabling positions on a pattern image of the multi-point AF system, and the like.

In this manner, at the desired measurement point where measurement is allowed during movement to the next shot area, a height position can be obtained from the detection output signal FS from a predetermined light-receiving cell during the movement when the X-Y stage 121 reaches a predetermined position. At a desired measurement point which does not pass through the pattern image during the movement to the next shot area and hence does not allow measurement during the movement, measurement is performed when the desired measurement point sufficiently approaches the pattern image. In other words, at the remaining desired measurement points which do not pass through the pattern image, measurement is performed at positions sufficiently near the desired measurement points.

As described above, from design items and known information before an exposure operation, a specific position to which the X-Y stage 121 reaches and at which a height position can measured, a specific light-receiving cell from which the detection output signal FS is output to allow measurement of the height position, and a specific position, in the exposure area, at which the height position can be measured from the detection output signal FS can be known in advance.

The MCU 130 sets the next target position in the driving section 122 to start moving the X-Y stage 121 to the next shot area. The position information during the movement is sequentially input from the driving section 122 to the MCU 130. The sequentially input position information about the X-Y stage 121 is compared with previously obtained measurement position information so that pieces of height position information can be obtained during the movement from detection output signals FS output from the predetermined light-receiving cells when the positions coincide with each other. A positional offset from the optimal focus position of the shot area in the direction of the optical axis is obtained from these pieces of height position information. The MCU 130 then outputs a control signal DS to the Z-DRV 118 to move the Z stage 120 by a predetermined amount. In addition, the MCU 130 drives the leveling stage 123 as needed to position the entire surface of the shot area within the depth of focus of the projection lens PL. At this time, the MCU 130 calculates the average plane (approximate plane) of the shot area surface by performing a statistical operation (e.g., the least square method) with respect to the plurality of height positions, and drives/controls the Z stage 120 and the leveling stage 123 to nullify the positional offset amount along the optical axis and the relative inclination angle between the calculated plane and the optimal imaging plane of the projection optical system.

The timings at which height measurement is performed during movement to the next shot area will be described next with reference to FIGS. 3A to 3C.

Figure 3A:
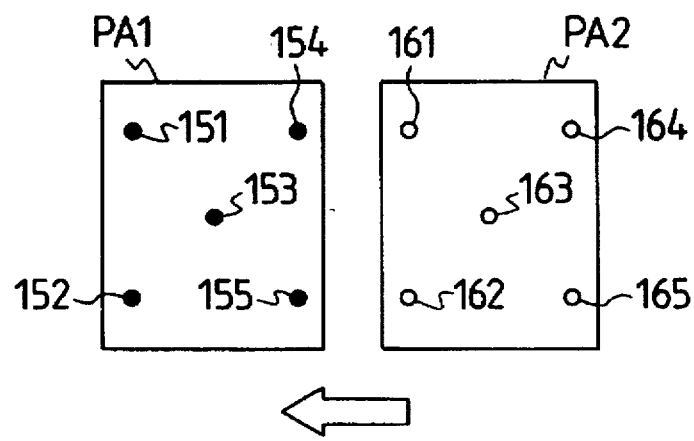
FIGS. 3A, 3B, and 3C are views for explaining an operation of measuring a height position at each of a plurality of measurement points in each shot area on a wafer during movement of an X-Y stage.

FIG. 3A shows a state wherein a first shot area PA1 after a projection/exposure operation and a second shot area PA2 to be projected/exposed next are set side by side. Five points 151 to 155 in the first shot area PA1 are measurement points where height positions are measured by the multi-point AF system. Five points 161 to 165 in the second shot area PA2 are desired measurement points which are preset in accordance with a stepped structure and the like in the shot area and at which height positions should be detected. When projection/exposure is completed with respect to the first shot area PA1, the X-Y stage 121 is driven in the direction indicated by the arrow in FIG. 3A until the second shot area PA2 is moved to the position of the first shot area PA1 in FIG. 3A.

Referring to FIG. 3A, of the desired measurement points, the points 161 and 162 are points which pass through the slit image ST during the movement, and more specifically points which coincide with the measurement points 154 and 155 during the movement. The remaining three points 163 to 165 are points which do not pass through the slit image ST during the movement.

Figure 3B:
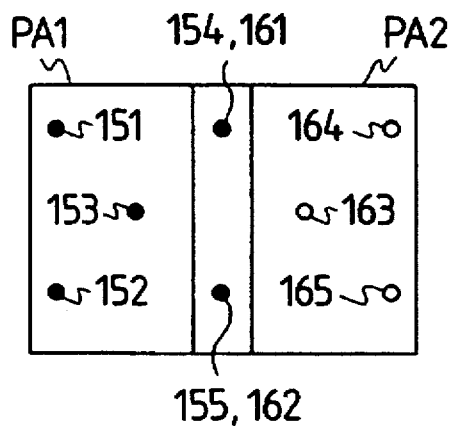
Figure 3C:
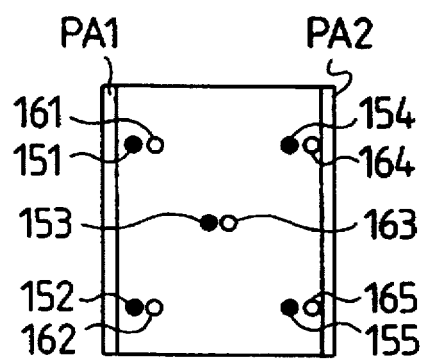

As shown in FIG. 3B, at the desired measurement points 161 and 162 which pass through the slit image ST, measurement can be performed during the movement when the points coincide with the measurement points 151 and 152. As shown in FIG. 3C, at the desired measurement points 163 to 165 which do not pass through the slit image ST, measurement can be performed during the movement when the points sufficiently approach the measurement points 153 to 155.

That is, of the five desired measurement points, the points 161 and 162 allow measurement at the respective desired measurement points during the movement, and the points 163 to 165 allow measurement at positions slightly shifted from the respective desired positions to the left in FIG. 3A during the movement.

As described above, in this embodiment, height positions are measured at the five measurement points 161 to 165 in the shot area PA2, which to be projected/exposed next, during a stepping operation of the X-Y stage 121, by using the multi-point AF system. In this case, the number of measurement points to be set in the next shot area PA2 is not specifically limited except that it should be plural. The number and positions of measurement points may be determined in accordance with a stepped structure and the like in the shot area. Even if only one measurement point is used by the multi-point AF system, since height positions can be measured at a plurality of measurement points in the shot area A2, the number of measurement points to be used is not specifically limited except that it should be one or more. It is essential that the number and positions of measurement points used by the multi-point AF system are determined in accordance with a stepped structure and the like in a shot area so as to divide a pattern image in the manner described above. In addition, when the measurement points 153 to 155 used by the multi-point AF system enter the shot area PA2 upon stepping of the X-Y stage 121, the height position of the surface of the shot area at each measurement can be detected. That is, on each of the scan traces of the three measurement points 153 to 155 in the shot area PA2, the height position of the surface at each measurement point can be easily detected by the multi-point AF system. Therefore, several measurement points, other than the five measurement points 161 to 165 in FIG. 3A, may be set on these scan traces so that the surface (approximate plane) of the shot area PA2 can be obtained on the basis of height positions measured at all these measurement points.

As shown in FIG. 3A, in this embodiment, the shot area PA2 to be projected/exposed next is moved in the direction indicated by the arrow (right to left on the drawing surface) with respect to the measurement points 151 to 155 used by the multi-point AF system. With this operation, height positions at the five measurement points 161 to 165 in the shot area PA2 are detected by using the three measurement points 153 to 155. In general, a large number of shot areas are set, on a wafer, in a matrix form, and all the shot areas are not stepped in the same direction when each shot area is exposed by the step-and-repeat scheme. That is, whenever a given shot area is stepped in the direction indicated by the arrow in FIG. 3A, any other shot area on the same wafer is present to be stepped in a direction opposite to that indicated by the arrow. When a given shot area is to be stepped in the direction opposite to that indicated by the arrow in FIG. 3A (left to right on the drawing surface), height positions at arbitrary measurement points in the shot area are detected through the three measurement points 151 to 153. For the above-descried reason, when exposure is to be performed by the step-and-repeat scheme, the MCU 130 selectively switches measurement points to be used by the multi-point AF system in accordance with the stepping direction of the X-Y stage 121. More specifically, the MCU 130 determines the number and positions of measurement points in accordance with the stepping direction of the X-Y stage 121, and sends the determined information to the selector circuit 113. With this operation, signals from only the light-receiving cells, on the array sensor 115, which correspond to the measurement points determined by the MCU 130 are input to the PSD 117 via the selector circuit 113, thereby selectively switching measurement points to be used by the multi-point AF system.

The embodiment has been described above without considering the inclination (unevenness) of the imaging plane of the projection optical system. In practice, however, the optimal imaging plane of the projection optical system is not always flat owing to inaccuracy in holding a reticle and the like. That is, in-focus points at the respective positions of the measurement points 151 to 155 are not always present within one plane and may be distributed unevenly as a whole. For this reason, the overall inclination of the imaging plane is calibrated two-dimensionally by using the plane parallel 112.

In the embodiment, height positions at the measurement points 161 and 162 in the shot area PA2, which should be measured at the measurement points 151 and 152, are measured in advance at the measurement points 154 and 155. Therefore, some consideration must be given to an offset amount Δz, based on the inclination of the imaging plane, between the measurement points 151 and 154 or between the measurement points 152 and 155.

More specifically, if calibration has been performed on the assumption that an in-focus point at the measurement 154 or 155 is located above an in-focus point at the measurement point 151 or 152 by the offset amount Δz, the offset amount Δz must be added to the actual measurement value at the measurement point 154 or 155. In addition, values measured at points near the measurement points 153 to 155 can be corrected, as needed, by a proper method such as linear extrapolation.

Note that in the embodiment, a pattern image constituted by two intersecting slit images is used. However, a pattern image constituted by a plurality of slit images, preferably three slit images, which are almost parallel to each other may be used.

In addition, the apparatus may use an AF system designed to project a bright/dark pattern on almost the entire surface of a shot area and focus light reflected by the surface on the light-receiving plane of an image pickup element (CCD camera or the like). This AF system is designed to obtain a height position of a shot area by detecting the offset amount of a position (or pitch) of a pattern image on the light-receiving plane with respect to a predetermined reference position. The greatest advantage of this AF system is that it can detect a height position at an arbitrary point in a shot area. With the use of such an AF system, therefore, even if conditions associated with a stepped structure and the like in a shot area change, a plurality of optimal measurement points can be selected in accordance with the change in conditions. Even if, for example, at least one pair of points of a plurality of points at which height positions should be measured differ from each other between two adjacent shot areas, measurement points can be properly selected and changed by using the above-described AF system.

In the embodiment, as a photosensitive substrate, a wafer used in the semiconductor manufacturing process has been described. It is, however, apparent that the present invention can be applied to other types of photosensitive substrates.

It is obvious that the embodiment can be modified as follows without departing the spirit and scope of the invention. A target focal plane may be obtained by performing averaging processing with respect to obtained height position information or weighted mean processing of averaging the total sum of weighting coefficients. In addition, selection and control of the optimal course for movement may be performed.

Some shot area located on the outermost periphery of the wafer W may be partly omitted. As is apparent, when a reticle pattern is to be transferred onto such a shot area, the number of measurement points where height position positions should be measured in the area may be decreased. For this reason, it is preferable that measurement points to be used in the area be selected from a plurality of measurement points of the multi-point AF system before movement to the area, and a height position be detected at least at one of the selected points when one of the plurality of measurement points of the multi-point AF system coincides with or comes close to the selected point.

Note that a pattern image projected on a wafer by the multi-point AF system may be elongated to set measurement points of the multi-point AF system outside the exposure field of the projection optical system.

The second embodiment of the present invention will be described next with reference to FIGS. 4 to 7. In this embodiment, the present invention is applied to a scan projection exposure apparatus using a pulse oscillation type light source, e.g., an excimer laser source, as a light source for exposure light.

Figure 4:
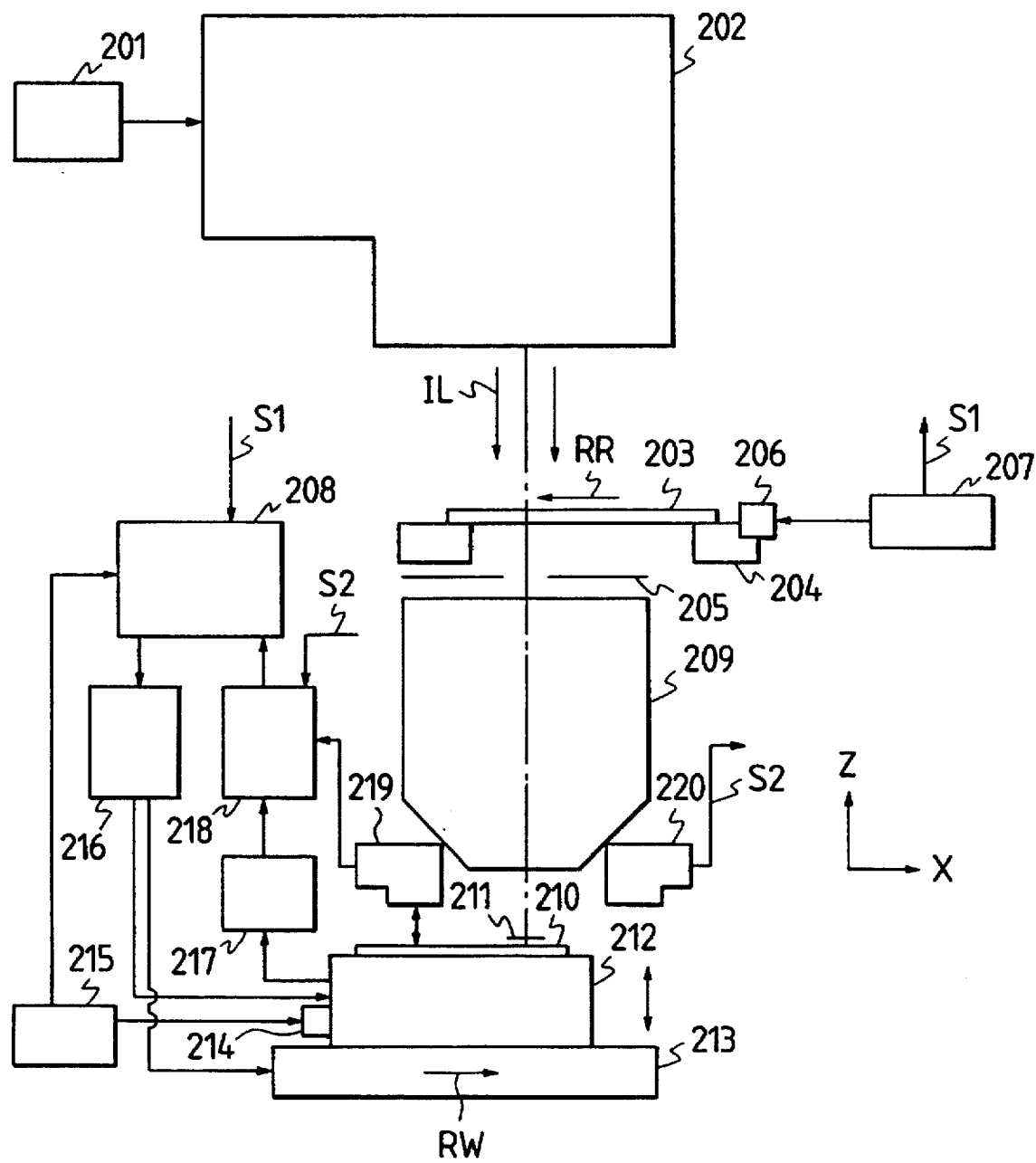
FIG. 4 is a block diagram showing the arrangement of a projection exposure apparatus according to the second embodiment of the present invention.

FIG. 4 shows a projection exposure apparatus of the embodiment. Referring to FIG. 4, pulse light from a pulse laser source 201 such as an excimer laser source is incident on an illumination optical system 202. The pulse light emission timing of the pulse laser source 201 is arbitrarily set by a trigger control section (not shown). The illumination optical system 202 comprises a beam shaping optical system, an attenuation optical system, an optical integrator, a field stop, a condenser lens system, and the like. Illumination light IL emerging from the illumination optical system 202 illuminates a reticle 203 with an almost uniform illuminance.

The reticle 203 is held on a reticle stage 204. The reticle stage 204 scans the reticle 203 in the X direction (or -X direction) perpendicular to the optical axis of a projection optical system 209 and parallel to the drawing surface of FIG. 4, and also performs positioning of the reticle 203 in the Y direction (perpendicular to the drawing surface of FIG. 4) perpendicular to the X direction. A reticle blind 205 having a rectangular opening formed therein is formed below the lower surface of the reticle stage 204. With this opening of the reticle blind 205, a rectangular illumination area is substantially set on the reticle 203. In addition, a movable mirror 206 is fixed on the reticle stage 204 so that a laser beam from an external reticle-side interferometer 207 is reflected by the movable mirror 206. The coordinates of the reticle stage 204 in the X and Y directions are constantly measured by this reticle-side interferometer 207. The measurement coordinate information SI is supplied to a main control system 208 for controlling the operation of the overall apparatus.

Of a pattern drawn on the reticle 203, an image of a portion restricted by the opening of the reticle blind 205 is projected on a wafer 210 as a photosensitive substrate, on which a photoresist is coated, via the projection optical system 209. An area conjugate to the area, on the reticle 203, restricted by the opening of the reticle blind 205 with respect to the reticle blind 205 serves as a rectangular exposure area 211. The wafer 210 is held on a Z leveling stage 212. the Z leveling stage 212 is placed on a wafer-side X-Y stage 213. The Z leveling stage 212 is constituted by a Z stage for positioning the wafer 210 in the Z direction as the direction of optical axis of the projection optical system 209, a leveling stage for inclining the exposure surface of the wafer 310 by a desired inclination angle, and the like. The wafer-side X-Y stage 213 is constituted by an X stage for scanning the wafer 210 in the X direction, and a Y stage for positioning the wafer 210 in the Y direction.

A movable mirror 214 is mounted on a side surface of the Z leveling stage 212 so that a laser beam from an external wafer-side interferometer 215 is reflected by the movable mirror 214. The X and Y coordinates of the wafer-side X-Y stage 213 are constantly measured by this wafer-side interferometer 215. The coordinate information measured in this manner is supplied to the main control system 208. A height (focus position) and an inclination which are currently set in the Z leveling stage 212 are detected by a position detection unit 217. The information about the detected height and inclination is supplied to a calculation unit 218. For example, the position detection unit 217 is constituted by a rotary encoder mounted on the shaft of a driving motor or a potentiometer for directly detecting a height.

Multi-point focus position detection units 219 and 220 are respectively arranged at two side surface portions of the projection optical system 209 in the X direction.

Figure 5:
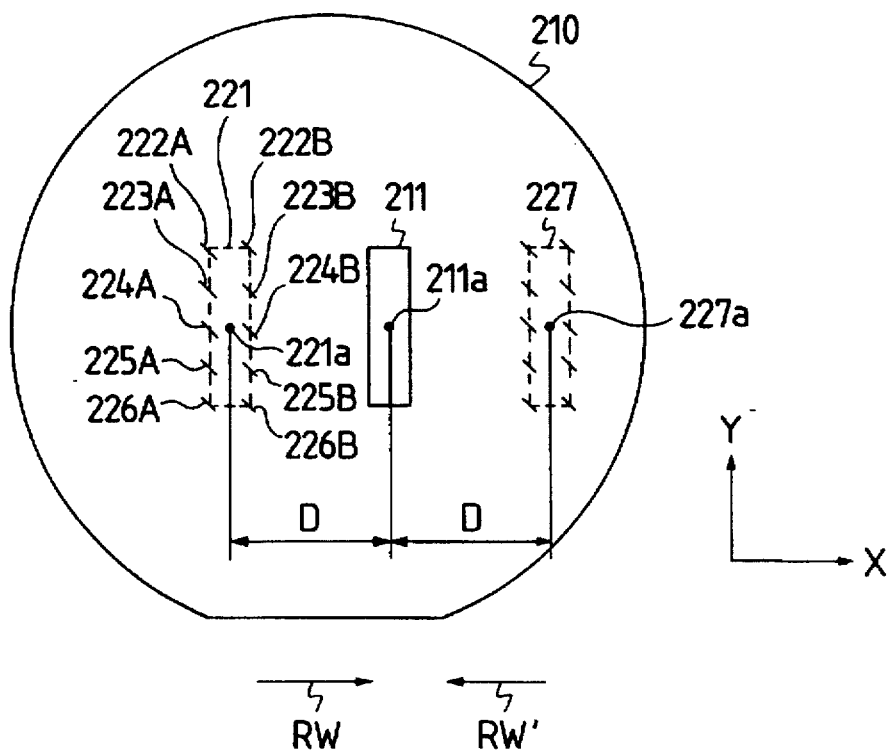
FIG. 5 is a plan view showing the relationship between an exposure area of each multi-point AF system in FIG. 4 and a detection area.

FIG. 5 shows the relationship between the detection areas of the multi-point focus position detection units (multi-point AF systems) 219 and 220 and the rectangular exposure area 211. Referring to FIG. 5, a detection area 221 having almost the same size as that of the exposure area 211 is set such that the center of the detection area 221 coincides with a position 221a separated from a center 211a of the exposure area 211 by a distance D in the -X direction. Slit pattern images are respectively projected from the first multi-point AF system 219 in FIG. 4, obliquely with respect to the normal line of the exposure surface of the wafer 210, onto five detection points 222A to 226A on the -X-direction side of the detection area 221 and five detection points 222B and 226B on the X-direction side of the detection area 221. As illumination light for projecting these slit pattern images, light in a wavelength band exhibiting low. photosensitivity with respect to a photoresist is used.

Light beams reflected by these 10 slit pattern images return to the multi-point AF system 219. The multi-point AF system 219 then generates 10 focus signals corresponding to lateral offset amounts of the re-formed images of the 10 slit pattern images with respect to reference positions. When the height of the wafer 210 changes in the Z direction, the positions of the re-formed images of the 10 slit pattern images are laterally offset. Therefore, the heights (focus positions) of the wafer 210 at the detection positions 222A to 226A and 222B to 226B of the detection area 221 are detected from the 10 focus signals.

Referring to FIG. 5, a detection area 227 having almost the same size as that of the exposure area 211 is set such that the center of the detection area 227 coincides with a position 227a separated from the center 211a of the exposure area 211 by the distance D in the X direction. Slit pattern images are respectively projected from the second multi-point AF system 220 in FIG. 4, obliquely with respect to the normal line of the exposure surface of the wafer 210, onto 10 detection points on the detection area 227. Light beams reflected by these 10 slit pattern images return to the multi-point AF system 220. The multi-point AF system then generates 10 focus signals corresponding to the heights of the wafer 210 at the 10 detection points. When, for example, the wafer 210 is to be scanned in a scan direction RW along the X direction, the height information detected by the first multi-point AF system 219 from the detection area 221 is used. In contrast to this, when the wafer 210 is to be scanned in a scan direction RW' along the -X direction, the height information detected by the second multi-point AF system 220 from the detection area 227 is used.

Referring back to FIG. 4, information S1 of the first set of 10 focus signals and information S2 of the second set of 10 focus signals, respectively output from the multi-point AF systems 219 and 220, are supplied to the calculation unit 218. As will be described later, the calculation unit 218 obtains a height and an inclination (a target height and a target inclination) to be set by the Z leveling stage 212 with respect to a shot area to be exposed next within the exposure area 211, on the basis of the focus position information read in advance. The calculation unit 218 then informs the main control system 208 of the information of the target height and the target inclination. The main control system 208 controls the operation of the Z leveling stage 212 through a wafer stage control unit 216 in accordance with this information. In addition, the main control system 208 scans the reticle stage 204 through a reticle stage control unit (not shown), and synchronously controls the scan operation of the wafer-side X-Y stage 213 through the wafer stage control unit 216.

In this embodiment, when exposure is to be performed by the scan scheme, for example, the wafer 210 is scanned by the wafer-side X-Y stage 213 in the scan direction RW (X direction) in synchronism with the scan operation of the reticle 203, performed by the reticle stage 204, in a scan direction RR (-X direction). In this case, letting β be the projecting magnification of the projection optical system 209, and VR be the scan speed of the reticle 203, the scan speed of the wafer 210 is represented by β·VR. With this operation, the whole pattern on the reticle 203 is sequentially exposed on the wafer 210. Note that the scan direction may be reversed. When the reticle 203 is to be scanned in the X direction, the wafer 210 is synchronously scanned in the -X direction.

The moving speeds of the reticle stage 204 and the wafer-side X-Y stage 213 in a scan exposure operation are determined by the amount of the pulse exposure light IL radiated on the reticle 203, the width of the opening of the reticle blind 205, and the sensitivity of the photoresist coated on the wafer 210. That is, the speed of each stage is determined such that the photoresist is sufficiently exposed within a period of time during which the pattern on the reticle 203 crosses the opening of the reticle blind 205 upon movement of the reticle stage 204. The distance D between the center 211a of the exposure area 211 and the center 221a (or 227a) of the detection area 221 (or 227) in FIG. 5 is set to be equal to or larger than a distance by which the wafer-side X-Y stage 213 moves during a delay time based on signal processing times taken in the multi-point AF system 219 (or 220) and the calculation unit 218.

An example of the exposure operation of this embodiment will be described next with reference to the flow chart in FIG. 7. This exposure operation is to be performed under the following conditions ① to ③.

① A reference plane including the surface of a shot portion on the wafer 210 is the imaging plane (optimal imaging plane) of the projection optical system 209.

② A height and an inclination set by the Z leveling stage 212 are the height and inclination of a wafer (super flat wafer) having a sufficient flatness obtained when the wafer is held on the Z leveling stage 212 via a wafer holder (not shown). The plane defined by these height and inclination set by the Z leveling stage 212 in this manner is called a "holder plane".

③ The rotational center of the Z leveling stage 212 in FIG. 4 during a leveling operation coincides with the center 211a of the exposure area 211 in FIG. 5. That is, when leveling is performed by the Z leveling stage 212, the height (focus position) of the wafer 210 at the center 211a of the exposure area 211 is not changed regardless of the X- and Y-coordinate values Of the wafer-side X-Y stage 213.

Under these conditions, in step 301 in FIG. 7, focus signals corresponding to the ten detection points 222A to 226A and 222B to 226B in the detection area 221 and the ten detection points in the detection area 227 in FIG. 5 are calibrated. For example, calibration of the focus signals corresponding to the detection points 222A to 226A and 222B to 226B in the detection area 221 is performed as follows. A test reticle having a focus measurement pattern formed thereon is placed on the reticle stage 204 in FIG. 4, and a wafer for test exposure, on which a photoresist is coated, is held on the Z leveling stage 212 in FIG. 4. The inclination of the Z leveling stage 212 is fixed to zero, and its height is set to a predetermined value. In this state, focus signals corresponding to the ten detection points are obtained by the multi-point AF system 219. Thereafter, the wafer-side X-Y stage 213 is driven to move a shot portion in the Z leveling stage 212 to the exposure area 211, and a test reticle pattern is exposed on the shot portion. In addition, ten focus signals are obtained by using other shot portions of the test wafer while changing the height (focus position) of each shot portion at the Z leveling stage 212 little by little, and the test reticle pattern is exposed to each shot portion.

Subsequently, by performing development of the wafer, the focus positions, i.e., the imaging positions of the projection optical system 209, at which the clearest test reticle pattern is formed at the detection points 222A to 226A and 222B to 226B in the detection area 221 in FIG. 5 are obtained and stored or memorized. With this operation, reference levels corresponding to the imaging positions of the projection optical system 209 are obtained for the respective focus signals corresponding to the detection points 222A to 226A and 222B to 226B. Similarly, reference levels corresponding to the imaging positions of the projection optical system 209 are obtained for the respective focus signals corresponding to the ten detection points in the other detection area 227.

Figure 6A:
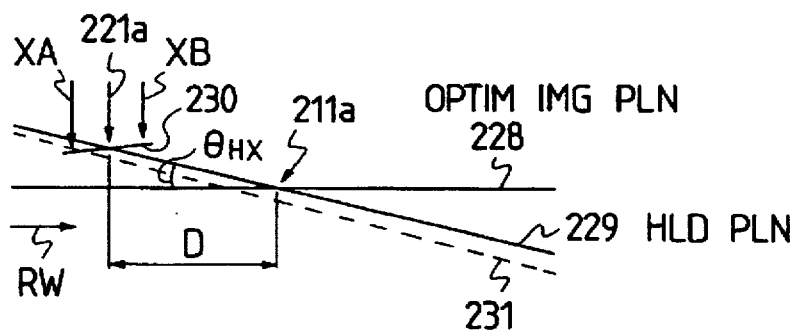
FIG. 6A is a view showing a state of a shot portion in a pre-read operation.

In step 302, the reticle 203 having a transfer pattern formed thereon is loaded on the reticle stage 204, and the photoresist-coated wafer 210 to be exposed is loaded on the Z leveling stage 212. Scan of the wafer 210 in the scan direction RW is started in synchronism with the start of scan of the reticle 203 in the scan direction RR. In step 303, as shown in FIG. 6A, when the center of a shot portion 230 on the wafer 210 reaches the center 221a of the detection area 221 of the multi-point AF system 219, focus signals corresponding to the detection points 222A to 226A (to be referred to as "detection points XA" hereinafter) and the detection points 222B to 226B (to be referred to as "XB detection points" hereinafter) shown in FIG. 5 are obtained by the multi-point AF system 219, and the obtained focus signals are supplied to the calculation unit 218. This operation is equivalent to an operation of obtaining the heights (focus positions) of the shot portion 230 at the detection points XA and XB. Let $Z_{1A}$ be the average of the heights measured at the five detection points XA, and $Z_{1B}$ be the average of the heights measured at the five detection values XB.

When the center of the shot portion 230 reaches the center 221a of the detection area 221, a height and an inclination set by the Z leveling stage 212 in FIG. 4, i.e., a height $Z_{HO}$ and an inclination at the center 211a of the exposure area 211 of a holder plane 229 in FIG. 6A, are detected by the Z leveling stage position detection unit 217. The detected height $Z_{HO}$ and inclination are supplied to the calculation unit 218. Note that an inclination is represented by the tangent of an inclination angle, and the inclinations of the holder plane 229 within the X-Z and Y-Z planes are respectively represented by $\theta_{HX}$ and $\theta_{HY}$.

In step 304, the calculation unit 218 obtains an average height $Z_{1C}$ of the shot portion 230, at the detection area 221, with reference to the holder plane 229 according to the following equation. In the equation, the distance D between the center 211a of the exposure area 211 and the center 221a of the detection area 221 can be regarded as a pre-read distance.

$$Z_{1C}=(Z_{1A}+Z_{1B})/2-D\cdot\tan\theta_{HX} \qquad (5)$$

The calculation unit 218 also obtains the average inclination of the shot portion 230, at the detection area 221, with reference to the holder plane 229. Note that since uneven portions are formed on the surface of the wafer 210 in the manufacturing process, the inclination of the shot area 230 on the wafer 210 means the average plane inclination within the shot portion 230, i.e., a local surface inclination on the wafer 210. Letting E be the distance between the detection point XA and the detection point XB in the X direction, and $\theta_{1X}$ be the inclination angle corresponding to the average inclination within the X-Z plane, the inclination $\tan\theta_{1X}$ is given as follows:

$$\tan\theta_{1X}=(Z_{1A}-Z_{1B})/E-\tan\theta_{HX} \quad (6)$$

In addition, if, for example, the average height of the detection points 222A and 222B in FIG. 5 is represented by $Z_{1D}$; the average height of the detection points 226A and 226B, $Z_{1E}$; and the distance between the detection point 222A and the detection point 226A in the Y direction, E, an inclination (inclination angle $\theta_{1Y}$) of the shot portion 230 within the Y-Z plane, at the detection area 221, with reference to the holder plane 229 can be obtained by the following equation:

$$\tan\theta_{1Y}=(Z_{1D}-Z_{1E})/E-\tan\theta_{HY} \quad (7)$$

In step 305, the calculation unit 218 obtains a height (target height) $Z_H$ and an inclination (target inclination) which are to be set by the Z leveling stage 212 when the shot portion 230 is to be moved to the exposure area 211 to be exposed. The obtained target height $Z_H$ and target inclination are values obtained by subtracting the average height and average inclination of the shot portion 230 from a height $Z_O$ and inclination of the optimal imaging plane 228 of the projection optical system 209 as a reference plane, respectively. That is, the target height $Z_H$ is represented as follows:

$$Z_H=Z_O-Z_{1C} \quad (8)$$

If the inclination angles of the imaging plane of the projection optical system 209 in the X-Z and Y-Z planes are represented by $\theta_{OX}$ and $\theta_{OY}$, respectively, inclination angles $\theta_X$ and $\theta_Y$, of the target inclination angle, in the X-Z and Y-Z planes are respectively represented as follows:

$$\tan\theta_X=\tan\theta_{OX}-\tan\theta_{1X}$$
$$\tan\theta_Y=\tan\theta_{OY}-\tan\theta_{1Y} \quad (9)$$

Figure 6B:
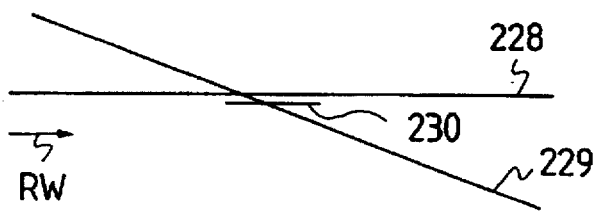
FIG. 6B is a view showing a state of the shot portion in an exposure operation.

Subsequently, in step 306, as shown in FIG. 6B, when the shot portion 230 on the wafer 210 reaches the exposure area 211, the main control system 208 sets the height to be set by the Z leveling stage 212 to the target height $Z_H$, and also sets the inclinations in the X-Z and Y-Z planes to be set by the Z leveling stage 212 to the target inclinations $\tan\theta_X$ and $\tan\theta_Y$, respectively. At the same time, in step 307, the main control system 208 causes the pulse laser source 201 to emit light to expose a pattern of the reticle 203 onto the shot portion 230 on the wafer 210. In this case, the shot portion 230 almost coincides with the optimal imaging plane 228.

Note that the above description is associated with an operation to be performed when exposure is performed with respect to a given shot portion 230 on the wafer 210. In practice, the exposure operation shown in FIG. 7 is time-serially repeated with respect to a series of shot portions on the wafer 210 in the X direction. That is, this embodiment is suitable for the step-and-repeat scheme.

As described above, according to the embodiment, a height and an inclination are pre-read with respect to each shot portion on the wafer 210, and the height and inclination of the Z leveling stage 212 are adjusted in an exposure operation on the basis of the detection results. Therefore, even if the exposure surface of the wafer 210 includes local uneven portions, a pattern of the reticle 203 can be exposed on the exposure surface of the wafer 210 while the entire exposure surface of the wafer 210 is aligned with the imaging plane of the projection optical system 209.

In the above-described embodiment, since the pulse laser source 201 is used as a light source for exposure light, an exposure timing can be accurately matched to a timing at which the shot portion 230 reaches the exposure area 211. However, even if continuous light emitted from a mercury lamp or the like is used as exposure light, the shot portion 230 can be almost accurately aligned with the imaging plane of the projection optical system 209 in an exposure operation by pre-reading the height and the like of the snot portion 230.

The third embodiment of the present invention will be described next. In this embodiment, the present invention is applied to the autofocus mechanism and auto-leveling mechanism of a projection exposure apparatus of a scan scheme.

Figure 8:
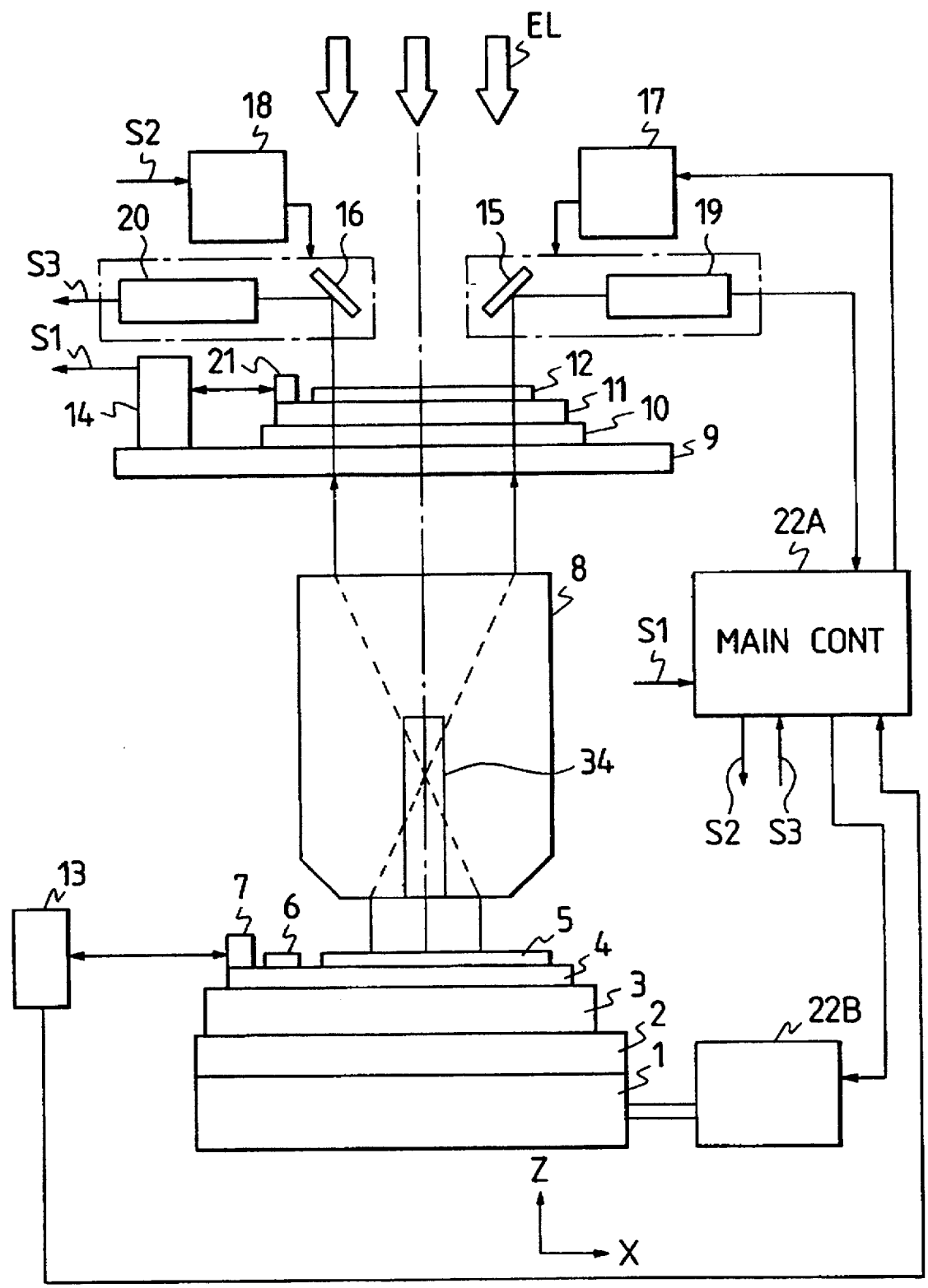
FIG. 8 is a block diagram showing the arrangement of a projection exposure apparatus according to the third embodiment of the present invention.

FIG. 8 shows a projection exposure apparatus of the embodiment. Referring to FIG. 8, a pattern on a reticle 12 is illuminated with a rectangular illumination area (to be referred to as a "slit-like illumination area" hereinafter) formed by exposure light. EL from an illumination optical system (not shown), and the pattern image is projected/exposed on a wafer 5 via a projection optical system 8. In this case, the reticle 12 is scanned with respect to the slit-like illumination area of the exposure light EL at a constant speed V in a forward direction (or backward direction) with respect to the drawing surface of FIG. 8. In synchronism with this operation, the wafer 5 is scanned at a constant speed $V/\beta$ ($1/\beta$ is the reduction magnification of the projection optical system 8) in the backward direction (or forward direction) with respect to the drawing surface of FIG. 8.

Driving systems for the reticle 12 and the wafer 5 will be described next. A reticle Y-axis driving stage 10 which can be driven in the Y-axis direction (a direction perpendicular to the drawing surface of FIG. 8) is mounted on a reticle support base 9. A reticle fine driving stage 11 is mounted on the reticle Y-axis driving stage 10. The reticle 12 is held on the reticle fine driving stage 11 by a vacuum chuck or the like. The reticle fine driving stage 11 serves to perform position control with respect to the reticle 12 in the X and Y directions parallel to the drawing surface of FIG. 8 within a plane perpendicular to the optical axis of the projection optical system 8 and in the rotational direction ($\theta$ direction) by a small amount and with high precision. A movable mirror 21 is mounted on the reticle fine driving stage 11 so that the positions of the reticle fine driving stage 11 in the X, Y, and $\theta$ directions are constantly monitored by an interferometer 14 mounted on the reticle support base 9. Position information S1 obtained by the interferometer 14 is supplied to a main control system 22A.

A wafer Y-axis driving stage 2 which can be driven in the Y-axis direction is mounted on a wafer support base 1. A wafer X-axis driving stage 3 which can be driven in the X-axis direction is mounted on the wafer Y-axis driving stage 2. A Z leveling stage 4 is further mounted on the wafer X-axis driving stage 3. The wafer 5 is held on the Z leveling stage 4 by vacuum suction. A movable mirror 7 is also fixed on the Z leveling stage 4, and the positions of the Z leveling stage 4 in the X, Y, and $\theta$ directions are monitored by an external interferometer 13. Position information obtained by the interferometer 13 is also supplied to the main control system 22A. The main control system 22A controls the positioning operations of the wafer Y-axis driving stage 2, the wafer X-axis driving stage 3, and the Z leveling stage 4 through a wafer driving unit 22B and the like, and also controls the operation of the overall apparatus.

A reference mark plate 6 is fixed near the wafer 5 on the Z leveling stage 4 to match a wafer coordinate system defined by coordinates measured by the interferometer 13 to a reticle coordinate system defined by coordinates measured by the interferometer 14. Various reference marks are formed on the reference mark plate 6. These reference marks include reference marks illuminated, from the lower surface side, with illumination light guided to the Z leveling stage 4 side, i.e., emissive reference marks.

Reticle alignment microscopes 19 and 20 are arranged above the reticle 12 to simultaneously observe reference marks on the reference mark plate 6 and marks on the reticle 12. In this case, deflection mirrors 15 and 16 are movably arranged to guide detection light from the reticle 12 to the reticle alignment microscopes 19 and 20, respectively. When an exposure sequence is started, the deflection mirrors 15 and 16 are retracted by mirror driving units 17 and 18, respectively, in accordance with commands from the main control system 22A.

In this embodiment, a conventional oblique incident type multi-point AF system like the one described with reference to FIGS. 27 and 28A to 28C is attached to the scan projection exposure apparatus shown in FIG. 8. Note that the multi-point AF system in the embodiment has a larger number of measurement points than that in the prior art and the arrangement of measurement points is devised.

Figure 9A:
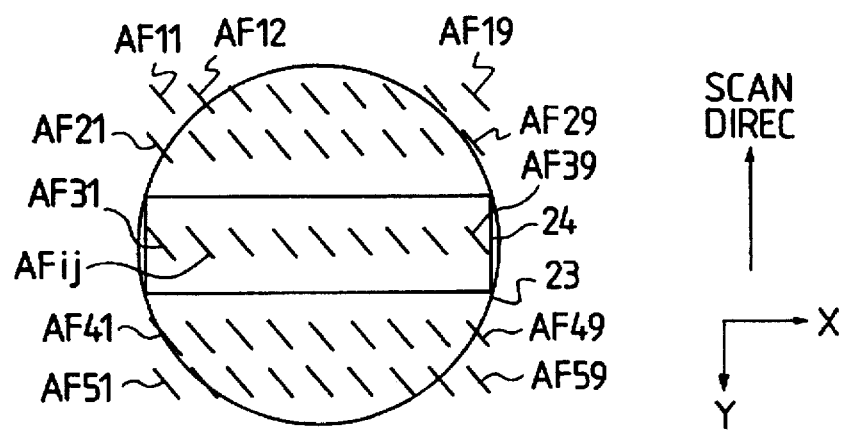
FIG. 9A is a plan view showing two-dimensional, slit-like opening pattern images projected on an area including the exposure field of a projection optical system in the third embodiment.
Figure 9B:
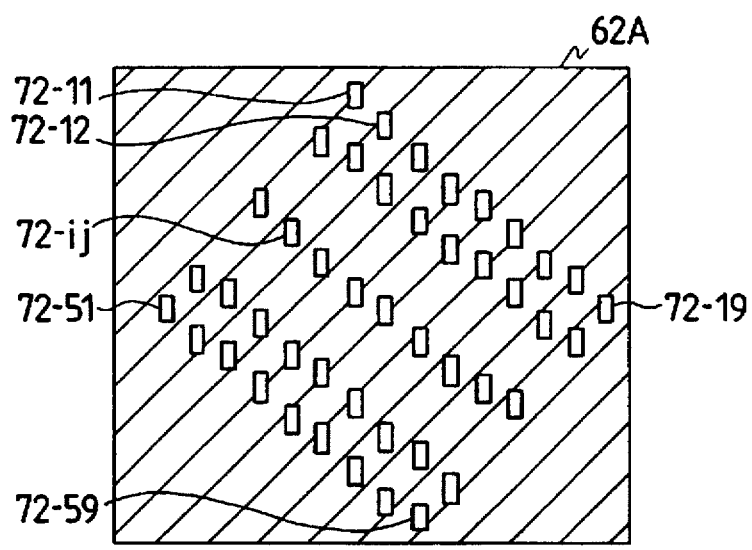
FIG. 9B is a view showing opening patterns on a pattern formation plate of each multi-point focus position detection system.

FIG. 9B shows a pattern formation plate 62A corresponding to the pattern formation 62 in the prior art. As shown in FIG. 9B, nine slit-like opening patterns 72-11 to 72-19 are formed in the first row of the pattern formation plate 62A. Similarly, sets of nine opening patterns 72-22 to 72-59 are respectively formed in the second to fifth rows. That is, a total of 45 slit-like opening patterns are formed on the pattern formation plate 62A. Images of these slit-like opening patterns are projected on the exposure surface of the wafer 5 in FIG. 8 obliquely with respect to the X- and Y-axes.

FIG. 9A shows the exposure surface of the wafer 5 below the projection optical system 8. Referring to FIG. 9A, patterns of the reticle 12 in FIG. 8 are exposed in a rectangular exposure area elongated in the X direction and inscribed to a circular illumination field 23 of the projection optical system 8. The wafer 5 is scanned with respect to the exposure area 24 in the Y direction. The multi-point AF system in this embodiment projects images of the slit-like opening patterns on two sets of nine measurement points AF11 to AF19 and AF21 to AF29 in the first and second rows located above the exposure area 24 along the Y direction and extending in the X direction, measurement points AF31 to AF39 in the third row within the exposure area 24, and two sets of measurement points AF41 to AF49 and AF51 to AF59 in the fourth and fifth rows located below the exposure area 24 along the Y direction.

Figure 9C:
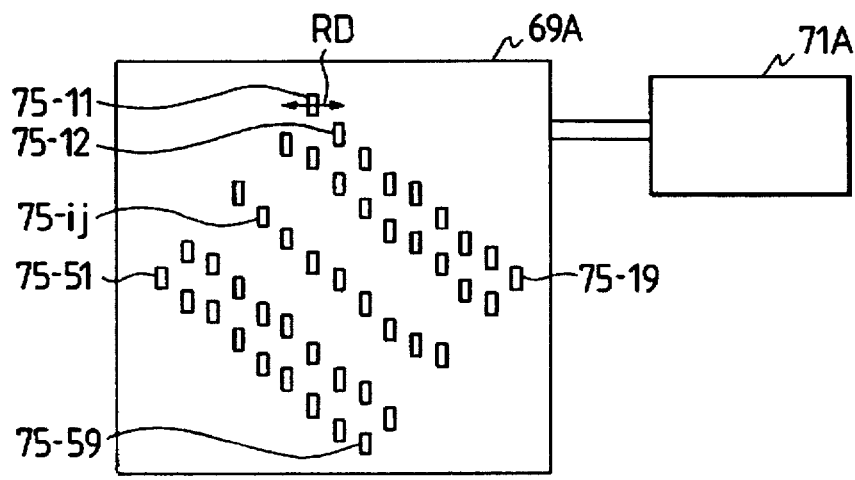
FIG. 9C is a view showing the arrangement of light-receiving elements on a light-receiving unit.

FIG. 9C shows a light-receiving unit 69A of the multi-point AF system in this embodiment. Nine light-receiving elements 75-11 to 75-19 are arranged in the first row on the light-receiving unit 69A, and sets of nine light-receiving elements 75-22 to 75-59 are respectively arranged in the second to fifth rows on the light-receiving unit 69A. That is, a total of 45 light-receiving elements are arranged on the light-receiving unit 69A. Slit-like stops (not shown) are respectively arranged on the light-receiving elements. The slit-like opening pattern images projected on the measurement points AF11 to AF59 are re-formed on the light-receiving elements 75-11 to 75-59, respectively. When light reflected by the exposure surface of the wafer 5 is rotated/vibrated by a vibration plate corresponding to the vibration plate 67 in FIG. 27, the position of each image formed again on the light-receiving unit 69A is vibrated in a direction RD as the widthwise direction of a corresponding stop.

Detection signals obtained by the respective light-receiving elements 75-11 to 75-59 are supplied to a signal processing unit 71A. The signal processing unit 71A performs synchronous detection with respect to each detection signal by using a signal of a rotational vibration frequency, thus generating 45 focus signals corresponding to the focus positions of the measurement points AF11 to AF59 on the wafer. The signal processing unit 71A then calculates the inclination angle (leveling angle) of the exposure surface of the wafer and an average focus position on the basis of predetermined focus signals of these 45 focus signals, as will be described later. The measured leveling angle and focus position are supplied to the main control system 22A in FIG. 8. The main control system 22A then sets the leveling angle and focus position of the wafer 5 through the wafer driving unit 22B and the Z leveling stage 4 on the basis of the supplied leveling angle and focus position.

Figure 10A:
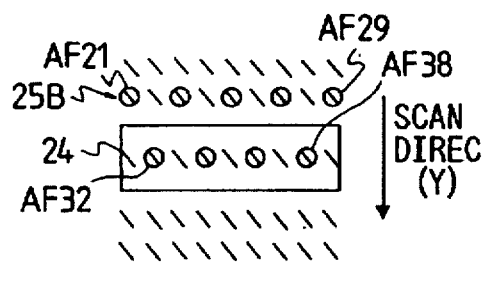
FIG. 10A is a view showing sample points selected when a split pre-read operation is performed in the third embodiment.
Figure 10B:
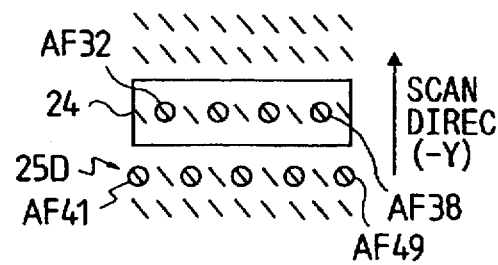
FIG. 10B is a view showing sample points selected when scan is performed in the reverse direction, and a split pre-read operation is performed.

In this embodiment, therefore, the focus position of all the 45 measurement points AF11 to AF59 can be measured. In the embodiment, however, as shown in FIGS. 10A and 10B, of the 45 measurement points, points (to be referred to as sample points hereinafter) at which focus positions are actually measured are changed in position in accordance with the scan direction of a wafer. Assume that the wafer is scanned with respect to the exposure area 24 in the Y direction, and split pre-read processing (to be described later) is performed, as shown in FIG. 10A. In this case, the odd-numbered measurement points AF21, AF23, ..., AF29 of the measurement points in a second row 25B, and the even-numbered measurement points AF32, AF34, ..., AF38 of the measurement points in the exposure area 24 are used as sample points. Assume that the wafer is scanned with respect to the exposure area 24 in the -Y direction, split pre-read processing (to be described later) is performed, as shown in FIG. 10B. In this case, the odd-numbered measurement points AF41, AF43, ..., AF49 of the measurement points in a fourth row 25D, and the even-numbered measurement points AF32, AF34, ..., AF38 of the measurement points in the exposure area 24 are used as sample points.

Figure 11A:
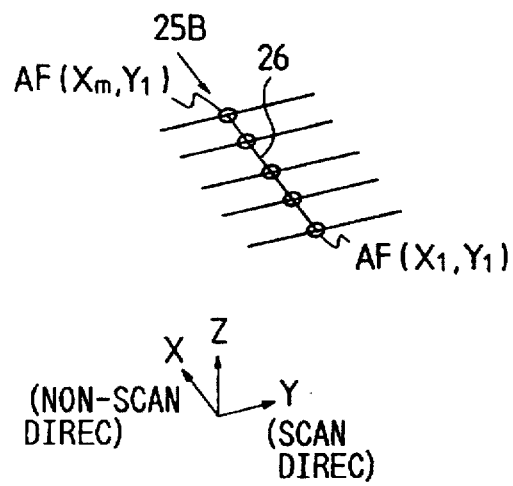
FIG. 11A is a view showing a case wherein focus positions are pre-read.
Figure 11B:
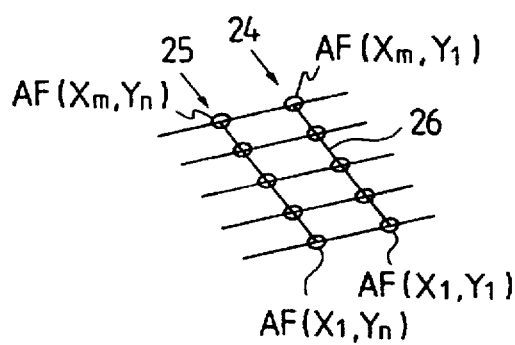
FIG. 11B is a view showing a case wherein exposure is performed by using the pre-read focus positions.

Since focus position measurement results during scan exposure sequentially change in accordance with moving coordinates of the wafer-side stage, the focus position measurement results are stored, as a two-dimensional map constituted by the coordinates of the stage in the scan direction and the coordinates of measurement points in the non-scan direction, in a storage unit in the main control system 22A in FIG. 8. The focus position and level angle of the wafer in an exposure operation are calculated by using the measurement results stored in this manner. When the focus position and level angle of the exposure surface of the wafer are to actually set by driving the Z leveling stage 4 in FIG. 8, the operation of the Z leveling stage 4 is controlled by open loop control in accordance with the measurement results. In this case, exposure in the exposure area 24 is performed on the basis of measurement results obtained in advance. That is, as shown in FIG. 11A, for example, focus positions of the area 26 on the wafer are measured at predetermined sampling points of the measurement points in the second row 25B. Thereafter, as shown in FIG. 11B, when the area 26 on the wafer reaches the exposure area 24, focusing and leveling control is performed with respect to the area 26 on the wafer on the basis of the measurement results obtained by the operation shown in FIG. 11A.

Figure 12:
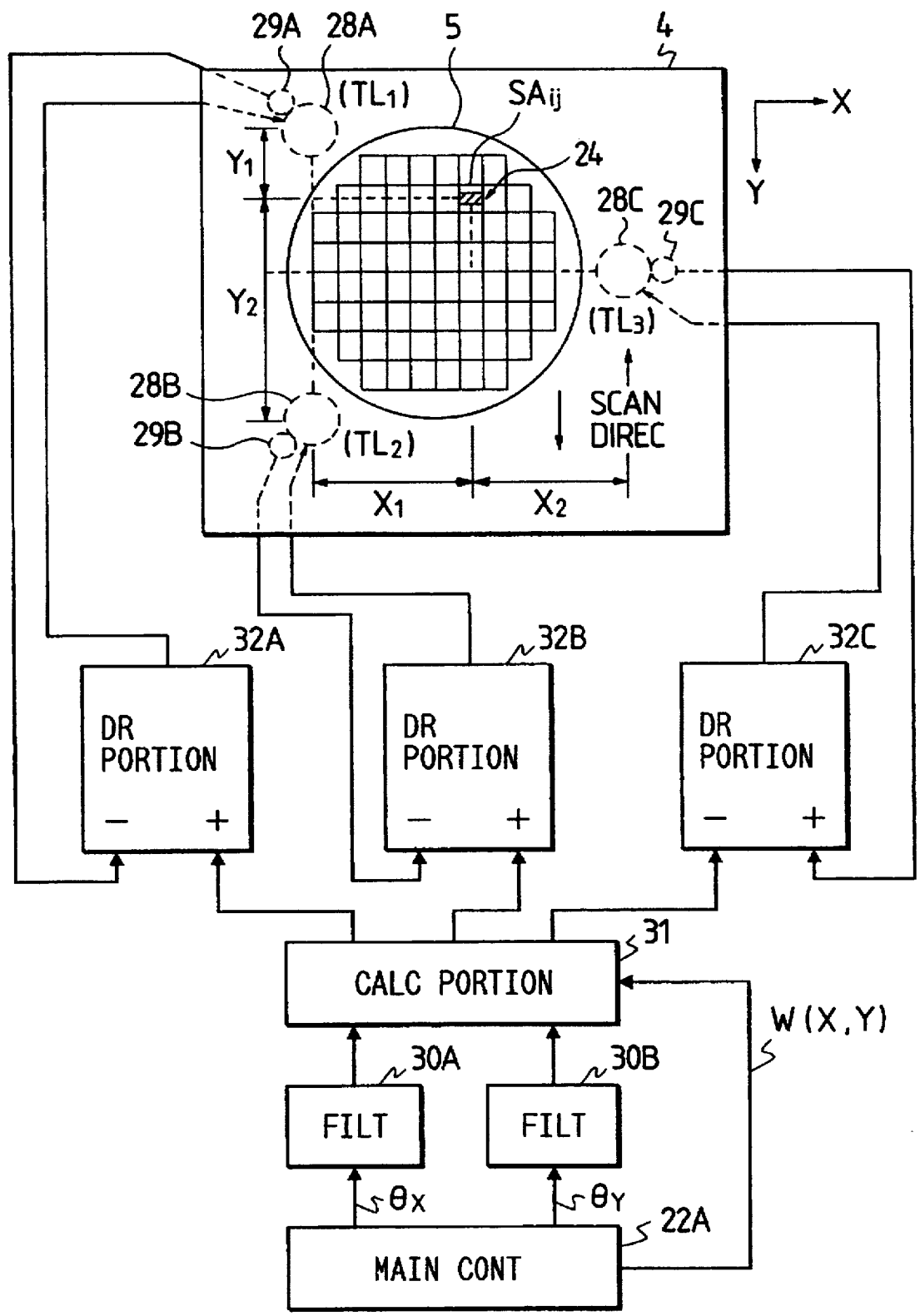
FIG. 12 is a block diagram showing the arrangement of autofocus and auto-leveling mechanisms and their control section in the third embodiment.

FIG. 12 shows the Z leveling stage 4 and its control system in this embodiment. Referring to FIG. 12, the upper surface member of the Z leveling stage 4 is supported on the lower surface member via three fulcrums 28A to 28C. The fulcrums 28A to 28C are extendible in the focusing direction. In addition, by adjusting the contraction/extension amounts of the fulcrums 28A and 28C, the focus position of the exposure surface of the wafer 5 on the Z leveling stage 4, an inclination angle $\theta_Y$ in the scan direction, and an inclination angle $\theta_X$ in the non-scan direction can be set to desired values, respectively. Height sensors 29A to 29C, each capable of measuring the displacement amount of a corresponding fulcrum in the focusing direction with a resolution of, e.g., about 0.01 μm, are respectively mounted near the fulcrums 28A to 28C. Note that as a positioning mechanism for the focusing direction (Z direction), a high-precision mechanism having a longer stroke may be separately arranged.

The main control system 22A supplies the inclination angles $\theta_X$ and $\theta_Y$, which change with time and should be respectively set in the non-scan and scan directions, to filter portions 30A and 30B in order to control the leveling operation of the Z leveling stage 4. The filter portions 30A and 30B obtain inclination angles by respectively filtering the supplied inclination angles according to different filter characteristics, and supply the obtained inclination angles to a calculating section 31. The main control system 22A supplies, to the calculating section 31, coordinates W (X,Y) of an area, on the wafer 5, which is to be exposed. The calculating section 31 supplies pieces of displacement amount information to driving sections 32A to 32C on the basis of the coordinates W (X,Y) and the two inclination angles. The driving sections 32A to 32C also receive pieces of information of the current heights of the fulcrums 28A to 28C from the height sensors 29A to 29C. The driving sections 32A to 32C respectively set the heights of the fulcrums 28A to 28C to the heights set by the calculating section 31.

With this operation, the inclination angles of the exposure surface of the wafer 5 in the scan and non-scan directions are respectively set to the desired values. In this case, owing to the difference in characteristics between the filter sections 30A and 30B, a response frequency fm [Hz] with respect to leveling in the scan direction is set to be higher than a response speed fn [Hz] with respect to leveling in the non-scan direction. For example, the response frequency fm [Hz] with respect to leveling in the scan direction is set to be 10 Hz, and the response speed fn [Hz] with respect to leveling in the non-scan direction is set to be 2 Hz.

If the positions where the fulcrums 28A, 28B, and 28C are arranged are referred to as driving points TL1, TL2, and TL3, the driving points TL1 and TL2 are arranged on a straight line parallel to the Y-axis, and the driving point TL3 is located on a perpendicular bisector that bisects a line segment connecting the driving points TL1 and TL2. Assuming that the slit-like exposure area 24 formed by the projection optical system is located on a shot area $SA_{ij}$ on the wafer 5, in this embodiment, in performing leveling control of the wafer 5 through the fulcrums 28A to 28C, the focus position of the shot area $SA_{ij}$ does not change. Therefore, leveling control and focusing control are separately performed. In addition, the focus position of the exposure surface of the wafer 5 is set by displacing the three fulcrums 28A to 28C by the same amount.

A leveling operation and a focusing operation in the embodiment will be described in detail next. Methods of calculating inclination angles for leveling and focus positions for focusing will be described first.

(A) Method of Calculating Inclination Angles

As shown in FIGS. 11A and 11B, letting Xm be the X coordinate mth sample point of the measurement points in each row in the non-scan direction, and Yn be the Y coordinate of the nth sample point in the scan direction, the value of a focus position measured at a sample point defined by the X coordinate Xm and the Y coordinate Yn is represented by AF $(X_m, Y_n)$. In addition, letting M be the number of sample points in the non-scan direction, and N be the number of sample points in the scan direction, the following calculations are performed. Note that a sum $\Sigma_m$ represents the sum of 1 to M in association with an affix m.

$$SX = \Sigma_m X_m, \ SX2 = \Sigma_m X_m^2, \ SMZ = \Sigma_m AF(X_m, Y_n),$$

$$SXZ = \Sigma_m (AF(X_m, Y_n) \cdot X_m) \quad (14)$$

Similarly, assuming that a sum $\Sigma_n$ represents the sum of 1 to N in association with an affix n, the following calculations are performed:

$$SY = \Sigma_n Y_n, \ SY2 = \Sigma_n Y_n^2, \ SNZ = \Sigma_n AF(X_m, Y_n),$$

$$SYZ = \Sigma_n (AF(X_m, Y_n) \cdot Y_n) \quad (15)$$

The following calculations are performed by using equations (14) and (15).

$$An = (SX \cdot SMZ - M \cdot SXZ)/(SX^2 - M \cdot SX2) \quad (16)$$

$$Am = (SY \cdot SNZ - N \cdot SYZ)/(SY^2 - N \cdot SY2) \quad (17)$$

An inclination angle AL $(Y_n)$ in the non-scan direction (X direction) at the nth sample point in the scan direction is obtained by least square approximation of the respective values An. In addition, an inclination angle AL $(X_m)$ in the scan direction (Y direction) at the mth sample point in the non-scan direction is obtained by least square approximation of the respective values Am. Thereafter, an inclination angle $\theta_X$ in the non-scan direction and an inclination angle $\theta_Y$ in the scan direction are obtained by the following averaging processing:

$$\theta_X = (\Sigma_n AL(Y_n))/N \quad (18)$$

$$\theta_Y = (\Sigma_m AL(X_m))/M \quad (19)$$

(B) Method of Calculating Focus Position

As methods of calculating a focus position, an averaging processing method and a maximum/minimum detection method are available. In this embodiment, a focus position is calculated by the maximum/minimum detection method. For reference, in the averaging processing method, a focus position <AF> of the overall exposure surface of the wafer 5 is calculated by using the above-mentioned focus position value AF $(X_m, Y_n)$.

$$<AF> = (\Sigma_n \Sigma_m AF(X_m, Y_n))/(M \cdot N) \quad (20)$$

In the maximum/minimum detection method, functions representing the maximum and minimum values are respectively represented by Max( ) and Min( ), and a focus position AF' of the overall exposure surface of the wafer 5 is calculated.

$$AF' = (Max(AF(X_m, Y_n)) + Min(AF(X_m, Y_n)))/2 \quad (21)$$

When the measured area 26 reaches the exposure area 24, as shown in FIG. 11B, the three fulcrums 28A to 28C in FIG. 12 are driven by the open loop scheme, with reference to the measurement results respectively obtained by the height sensors 29A to 29C, on the basis of the detection results $\theta_X$, $\theta_Y$, and AF' respectively obtained by equations (18), (19), and (21). More specifically, autofocus control is executed by simultaneously driving the three fulcrums 28A to 28C, whereas auto-leveling control is executed such that the focus position in the exposure area 24 shown in FIG. 12 is not changed.

Referring to FIG. 12, let $X_1$ be the distance between the center of the exposure area 24 and the fulcrums 28A and 28B in the X direction; $X_2$ be the distance between the center of the exposure area 24 and the fulcrum 28C in the X direction; $Y_1$ be the distance between the center of the exposure area 24 and the fulcrum 28A in the Y direction; and $Y_2$ be the distance between the center of the exposure area 24 and the fulcrum 28B in the Y direction. The fulcrums 28A and 28B and the fulcrum 28C are respectively displaced in opposite directions at a ratio of $X_1:X_2$ on the basis of the calculated inclination angle $\theta_X$ in the non-scan direction. The fulcrums 28A and 28B are then displaced in opposite directions at a ratio of $Y_1:Y_2$ on the basis of the calculated inclination angle $\theta_Y$ in the scan direction.

In the above-described processing method, since the focus position and the inclination angle change with time depending on the exposure apparatus, the actual measurement value of the focus position needs to be corrected.

FIG. 13A shows a state wherein the overall focus position and inclination angle of the area 26 on an exposure surface 5a on a wafer are measured at a given focus position measurement point (AF point). In the state shown in FIG. 13A, assume that driving amounts <TL1>, <TL2>, and <TL3> of the fulcrums at the driving point TL1 to TL3 in the focus direction are zero (reference positions). As shown in FIG. 13B, when the area 26 reaches an exposure point in an exposure area, the driving amounts for exposure are respectively set as <TL1>=a, <TL2>=b, and <TL3>=c. In this case, the focus position, of an area 26A, measured at the focus position measurement point (AF point) is changed with respect to the state shown in FIG. 13A by ΔF. However, this change amount ΔF is influenced by the driving amounts at the respective driving points TL1 to TL3. For this reason, when the area 26 is to be exposed next, leveling and focusing need to be performed so as to correct the driving amounts at the respective driving points TL1 to TL3 in the state shown in FIG. 13B.

Assume that the focus position, the inclination angle in the X direction, and the inclination angle in the Y direction which are measured with respect to the area 26 are respectively represented by $F_1$, $\theta_{1X}$, and $\theta_{1Y}$, and that the focus position, the inclination angle in the X direction, and the inclination angle in the Y direction which are measured with respect to the area 26a are respectively represented by $F_n'$, $\theta_{nX}'$, and $\theta_{nY}'$. In addition, if the distances between a focus position measurement point (AF point) and an exposure point in the X and Y directions are respectively represented by ΔX and ΔY, a focus position correction amount ΔF1 is given as follows:

$$\Delta F1 = -F_1 - \theta_{1X} \cdot \Delta X - \theta_{1Y} \cdot \Delta Y \tag{22}$$

With this correction amount ΔF1, values $F_n$, $\theta_{nX}$, an $\theta_{nY}$ obtained by correcting the focus position, the inclination angle in the X direction, and the inclination angle in the Y direction which are measured with respect to the area 26A are given as follows:

$$F_n = F_n' + \Delta F1 \tag{23}$$

$$\theta_{nX} = \theta_{nX}' - \theta_{1X} \tag{24}$$

$$\theta_{nY} = \theta_{nY}' - \theta_{1Y} \tag{25}$$

In addition, the response characteristics must be managed so as not to follow up high-frequency uneven portions of the exposure surface of the wafer 5. When the scan speed of the wafer 5 changes, a response corresponding to the stage position is also required. For this reason, measured focus positions and measured inclination angles may be managed by a numerical filter for fast Fourier transform (FFT) or some mechanism may be devised to change the servo gains of the driving sections at the three fulcrums 28A to 28C in FIG. 12 in accordance with the speed of the wafer 5. Note that the FFT numerical filter requires pre-read, and servo gains cause phase delays. Therefore, in the above-mentioned methods, some mechanisms need to be devised in consideration of these factors.

(C) Variable Servo Gain Method

An example of the method of changing the servo gains of the driving sections at the three fulcrums 28A to 28C in FIG. 12 in accordance with the speed of a wafer will be described below. If a response frequency set when the scan speed of the wafer is V/β is represented by v, a transfer function G(s) is represented as follows:

$$G(s) = 1/(1+Ts) \tag{26}$$

for $T=1/(2\pi v)$ and $s=2\pi fi$.

It was found from an analysis result that when the scan speed V/β was 80 mm/s, 2 Hz were optimal for the response frequency v in the non-scan direction, and 10 Hz were optimal for the response frequency v in the scan direction. If an uneven portion on the exposure surface of the wafer is represented by a sine wave, and the length of each shot area on the wafer in the scan direction is represented by $L_0$, the frequency f in equation (26) is given as follows:

$$f = (V/\beta)/L_0 \cdot (L_0/p) = (V/\beta)/p \tag{27}$$

That is, as the scan speed V/β changes, the frequency f also changes. For this reason, the optimal response frequency v must be obtained again. Each servo gain is determined on the basis of the response frequency v obtained in this manner.

(D) Numerical Filtering Method

In this case, since the pitch of the uneven portion of the exposure surface of the wafer is a function dependent on the stage position, if sampling of a focus position is performed at a reference position in synchronism with the stage position, control can be performed independently of the scan speed V/β. More specifically, in order to obtain a filtering effect equivalent to that obtained by the transfer function G(s) by using a position function, inverse Fourier transform of the transfer function G(s) is performed to obtain a position function F(x), and numerical filtering is performed by using this position function F(x). FIG. 14A shows an example of the transfer function G(s) of the response frequency v. FIG. 14B shows the corresponding position function F(x). Note that numerical filtering requires an approach scan distance. Without this, a phase delay occurs.

Figure 22A:
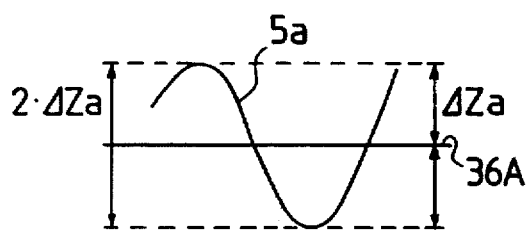
FIG. 22A is a graph showing a focus error in a case wherein autofocus control is performed by using the maximum and minimum values of measurement values.
Figure 22B:
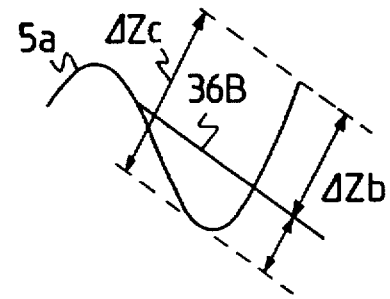
FIG. 22B is a graph showing a focus error in a case wherein autofocus control is performed by using the average of measurement values.
Figure 22C:
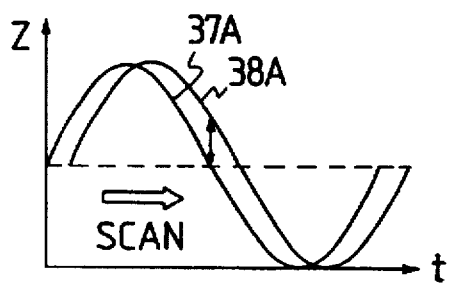
FIG. 22C is a graph showing a time delay error.
Figure 22D:
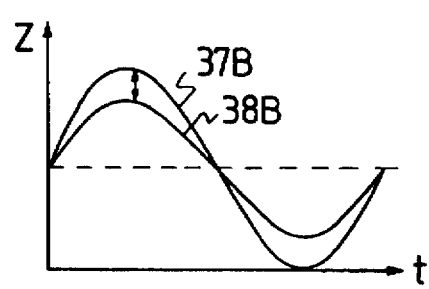
FIG. 22D is a graph showing a change in servo gain.
Figure 23:
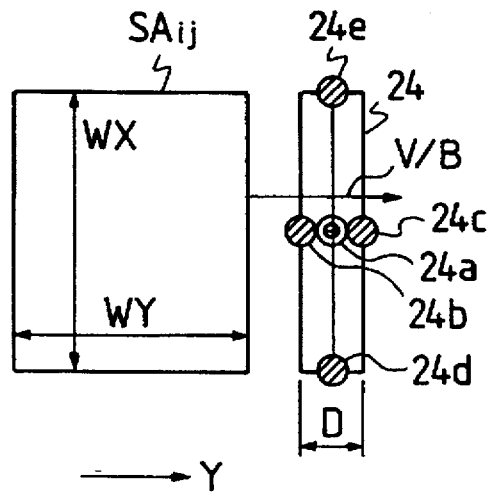
FIG. 23 is a plan view showing a state wherein exposure is performed with respect to a shot area on a wafer with a slit-like exposure area.

In both the variable servo gain method and the numerical filtering method, response characteristics are managed by a phase delay and a filtering effect. A phase delay (time delay) means a time delay present between a signal corresponding to a target focus position indicated by a curve 37A in FIG. 22C and a signal corresponding to an actually measured focus position indicated by a curve 38A. A filtering effect means a reduction in amplitude of an actual focus position with respect to a target focus position by a predetermined amount, as indicated by curves 37A and 37B in FIG. 22D.

As described above, in this embodiment, when exposure is to be performed with respect to each shot area on a wafer, approach scan as preliminary scan is performed in some case. A method of setting an approach scan distance will be described next.

FIG. 15A shows a scan method in which after exposure with respect to a shot area $SA_{11}$ on a wafer is completed, reticle patterns are sequentially exposed on adjacent shot areas $SA_{12}$ and $SA_{13}$. Referring to FIG. 15A, the wafer is scanned in the -Y direction to complete exposure with respect to the shot area $SA_{11}$ on the wafer. Thereafter, the wafer is moved obliquely with respect to the X-axis and the Y-axis in an acceleration/deceleration interval $T_{W1}$ to set a portion near the lower end of the next shot area $SA_{12}$ at a position near the exposure area of the projection optical system. The wafer is moved in the Y direction by a distance $\Delta L$ in the interval between the instant at which exposure with respect to the first shot area $SA_{11}$ is completed and the instant at which the portion near the lower end of the next shot area $SA_{12}$ is moved to the position near the exposure area. At the end of the acceleration/deceleration interval $T_{W1}$, movement of the wafer in the Y direction is started.

In a subsequent settling interval $T_{W2}$, the scan speed of the wafer reaches almost the speed $V/\beta$. In a subsequent exposure interval $T_{W3}$, a reticle pattern is exposed on the shot area $SA_{12}$. FIG. 15C shows the acceleration/deceleration interval $T_{W1}$, the settling interval $T_{W2}$, and the exposure interval $T_{W3}$ on the wafer side. FIG. 15B shows an acceleration/deceleration interval $T_{R1}$, a settling interval $T_{R2}$, and an exposure interval $T_{R3}$ on the reticle side. Note that on the reticle side, since movement to the adjacent shot area as in FIG. 15A is not required, the movement of the reticle-side stage is a reciprocal movement along the Y-axis. On the wafer side, as shown in FIG. 15C, sapling of a focus position is started by the multi-point AF system from a time point $t_s$ at which the acceleration/deceleration interval $T_{W1}$ shifts to the settling interval $T_{W2}$.

In this embodiment, since the response characteristics at the time of leveling and focusing are managed by a phase delay and a filtering effect, the start point at which sampling of a focus position is started on a wafer differs depending on a state. For example, if numerical filtering is to be performed to synchronize sampling with the stage position, a sampling start point is determined by the following procedure.

First, as shown in FIG. 14A, the transfer function G(s) is given. The position function F(x) shown in FIG. 14B is then obtained by inverse Fourier transform using this transfer function G(s). A length $\Delta L$ from the origin of the position function F(x) to a zero-crossing point is obtained. As shown in FIG. 15A, this length $\Delta L$ is qual to a moving amount $\Delta L$ in the Y direction by which the scan spot is obliquely moved to the adjacent shot area $SA_{12}$ to perform exposure.

In addition, since the acceleration/deceleration interval $T_{W1}$ on the wafer side is shorter than the acceleration/deceleration interval $T_{R1}$ on the reticle side, a time ($R_{R1}$–$T_{W1}$) is a wait time on the wafer side. In this case, if $\Delta L<(V/\beta)(T_{R1}-T_{W1})$, no decrease in throughput occurs. If, however, $\Delta L>(V/\beta)(T_{R1}-T_{W1})$, the throughput decreases. Note that a length $\Delta Y$ represented by $\Delta Y=\Delta L-(V/\beta)(T_{R1}-T_{W1})$ may be handled as a phase delay, or may be handled as a fixed function if the same filtering effect as that obtained by the transfer function G(s) can be obtained. By performing such filtering, the reduction in air fluctuation with respect to the multi-point AF system and the influence of control errors of the multi-point AF system can be expected.

Next, consider the arrangement of sample points of measurement points of the multi-point AF system in the scan projection exposure apparatus of this embodiment. Assume that in FIG. 9A, focus position measurement results at the measurement points AF31 to AF39 in the slit-like exposure area 24, of the measurement points AF11 to AF59 of the multi-point AF system are to be used, i.e., the measurement points AF31 to AF39 are to be used as sample points. In this case, similar to the case of a conventional stepper, control is performed by the "exposure position control method". In addition, since scan of a wafer in this embodiment is performed in the Y or -Y direction, if sample points of the measurement points are arranged before the scan direction with respect to the exposure area 24, pre-read control, time-divisional leveling measurement, measurement value averaging, and the like can be performed.

The pre-read control means that when the wafer is to be scanned with respect to the exposure area 24 in the -Y direction as shown in FIG. 9A, sample points are also selected from the downstream measurement points AF41 to AF49 and AF51 to AF59. By performing pre-read control, a follow-up error with respect to an actual response frequency is $|1-G(x)|$ where G(s) is the transfer function for the autofocus mechanism and the leveling mechanism. Note that since this follow-up error includes phase delay and filtering error factors, if pre-read control is performed, the phase delay can be removed. Since the error is $1-|G(s)|$, a transfer ability about four times that obtained without pre-read control can be obtained.

Figure 16A:
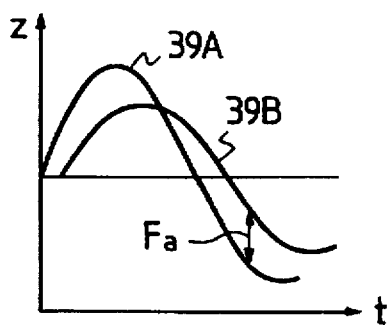
FIG. 16A is a graph showing the follow-up precision obtained when leveling and focusing are performed by an exposure position control method.
Figure 16B:
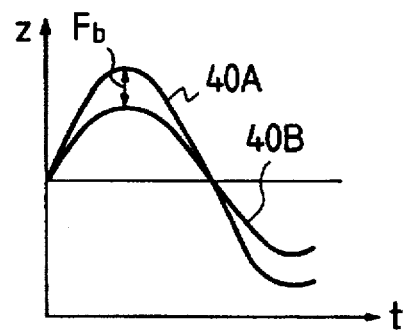
FIG. 16B is a graph showing the follow-up precision obtained when leveling and focusing are performed by a pre-read control method.

FIG. 16A shows a curve 39A corresponding to a target focus position in a case wherein the same exposure position control as that in the prior art is performed, and a curve 38B corresponding to an actually set focus position. FIG. 16B shows a curve 40A corresponding to a target focus position in a case wherein pre-read control is performed, and a curve 40B corresponding to an actual set focus position. In the case of exposure position control, a phase shift occurs. A difference Fa between the target position and the follow-up position in the case of exposure position control is about four times a difference Fb between the target position and the follow-up position in the case of pre-read control. That is, the transfer ability obtained by pre-read control is about four times that obtained by exposure position control.

As described above, as a response frequency for auto-leveling, about 10 Hz is suitable in the scan direction (in the exposure position control method). Therefore, with pre-read control, a filtering response of about 2.5 Hz in the scan direction is sufficient. If this filtering is performed by a numerical filter or a control gain, an approach scan length of about 5 ($\cong 80/(2\pi*2.5)$) mm is required before exposure, provided that the scan speed of the wafer is 80 mm. Focus errors in the two methods will be described below.

Figure 24A:
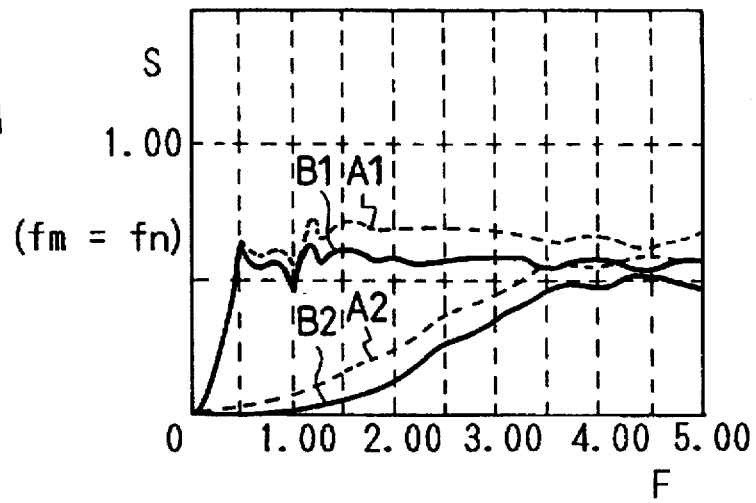
FIG. 24A is a graph showing the calculation result of an error parameter S with respect to a curving parameter F in a case wherein leveling control is performed while the response frequency in the scan direction is set to be equal to that in the non-scan direction.
Figure 24B:
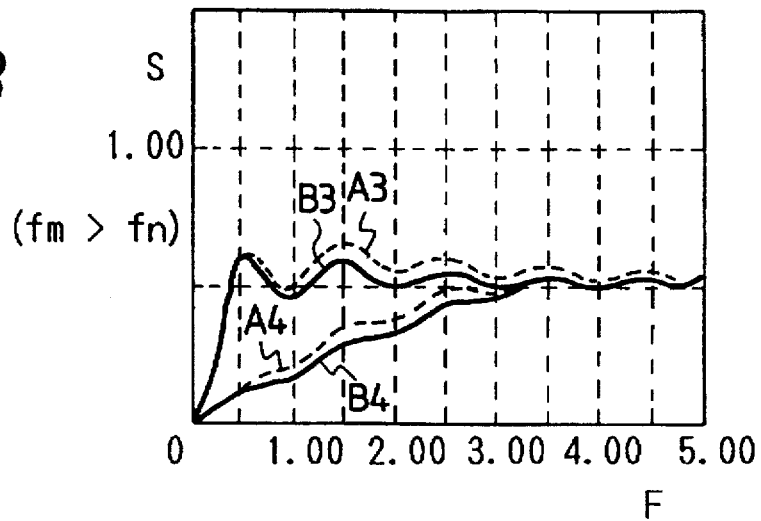
FIG. 24B is a graph showing the calculation result of an error parameter S with respect to a curving parameter F in a case wherein leveling control is performed while the response frequency in the scan direction is set to be higher than that in the non-scan direction.
Figure 25A:
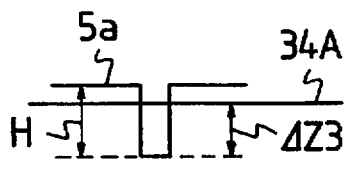
FIG. 25A is a view showing a state wherein autofocus control is performed by using the average of focus positions.
Figure 25B:
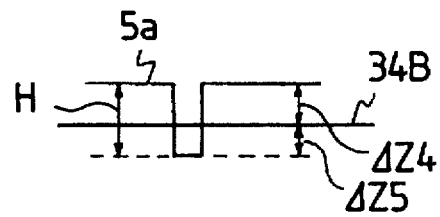
FIG. 25B is a view showing a state wherein autofocus control is performed by using the average of the maximum and minimum values of focus positions.
Figure 26A:
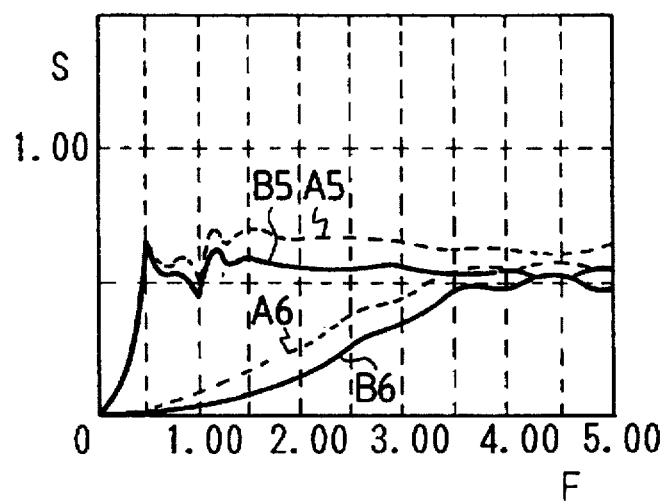
FIG. 26A is a graph showing the calculation result of an error parameter S with respect to a curving parameter F in a case wherein autofocus control is performed by an averaging process in the state shown in FIG. 24A.
Figure 26B:
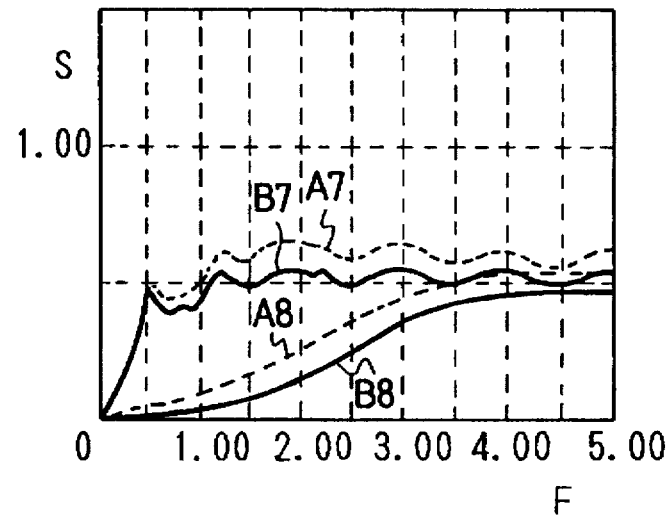
FIG. 26B is a graph showing the calculation result of an error parameter S with respect to a curving parameter F in a case wherein autofocus control is performed by using the average of the maximum and minimum values of focus positions in the state shown in FIG. 24B.
Figure 27:
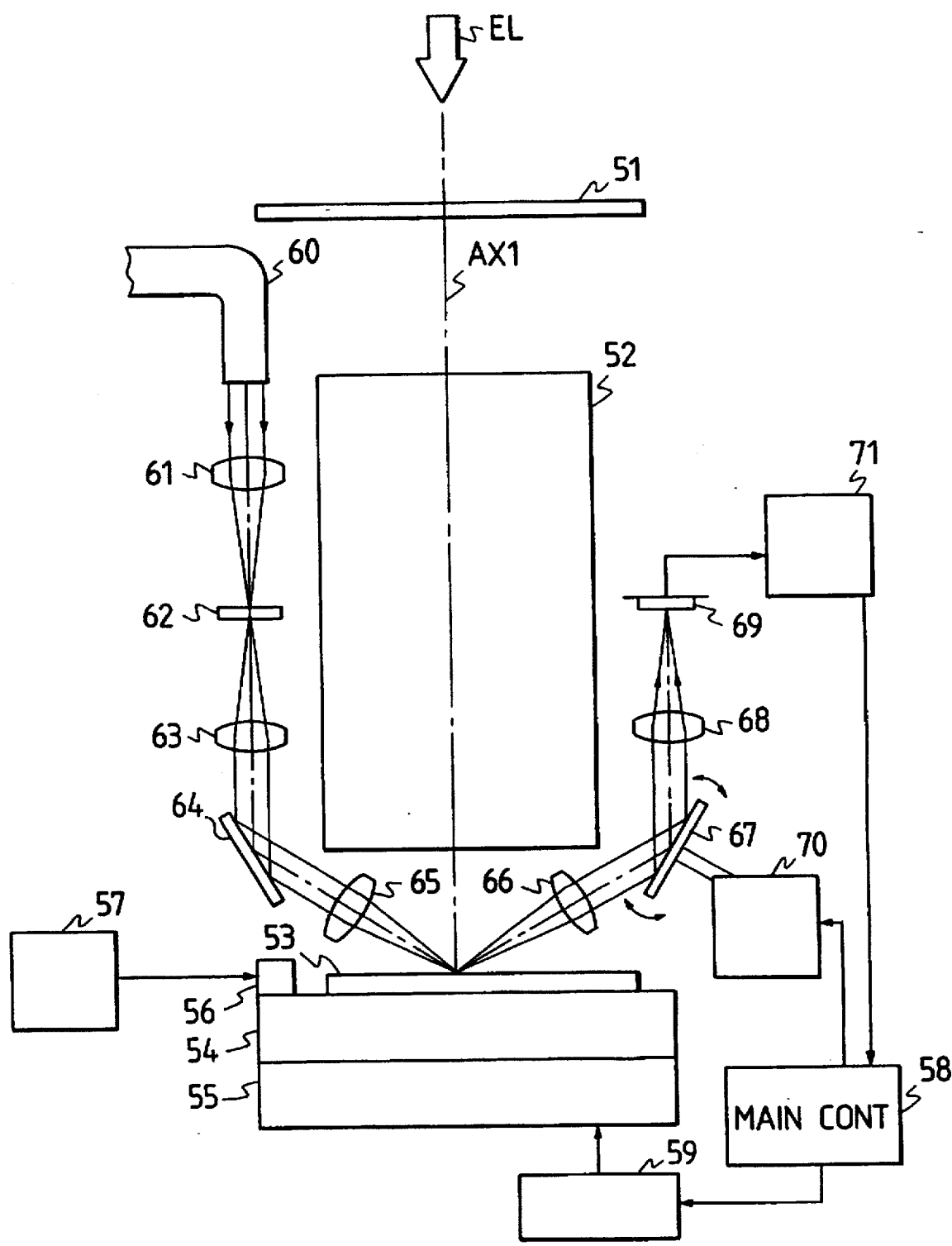
FIG. 27 is a block diagram showing the arrangement of a multi-point focus position detection system in a conventional stepper.
Figure 28A:
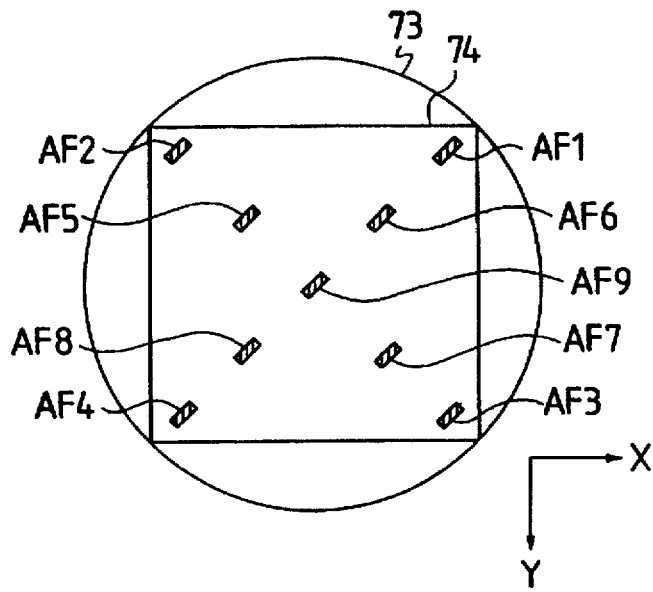
FIG. 28A is a plan view showing two-dimensional, slit-like opening pattern images projected on an area including the exposure field of a projection optical system in FIG. 27.
Figure 28B:
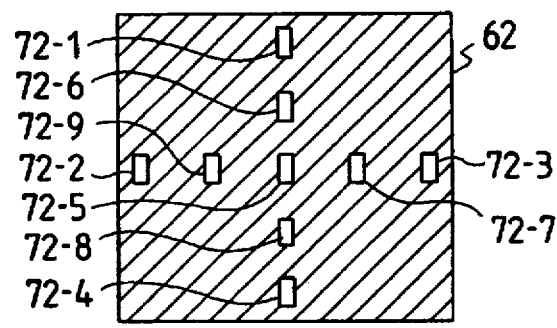
FIG. 28B is a view showing opening patterns on a pattern formation plate of the multi-point focus position detection system in FIG. 27.
Figure 28C:
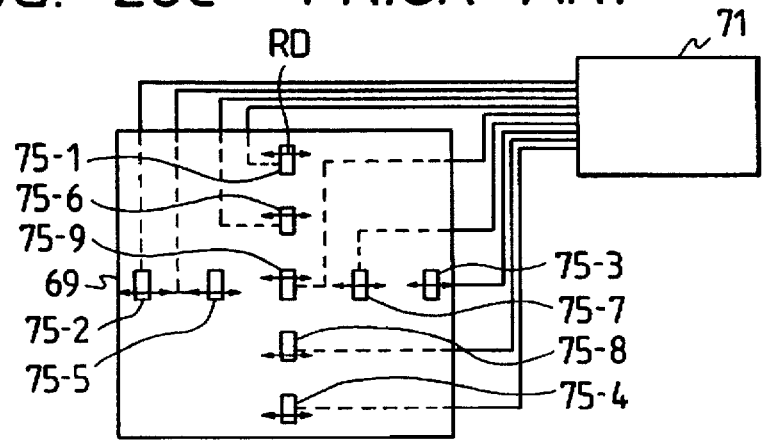
FIG. 28C is a view showing the arrangement of light-receiving elements on a light-receiving unit in FIG. 27.

For this purpose, similar to the case shown in FIGS. 24A and 24B, the period of periodic curving of a shot area $SA_{ij}$ on the wafer in the scan direction is represented by a curving parameter F as a ratio of the curving to the width in the scan direction, and a focus error at each measurement point, caused when this periodic curving occurs, is represented by the sum of the absolute value of the average of focus position errors at the respective measurement points and ⅓ the amplitude of each focus position error. In addition, the amplitude of the periodic curving of the curving parameter F is normalized to 1, and an error parameter S exhibiting the maximum value of the focus errors at the respective measurement points when the curving parameter is represented by F is represented by a ratio with respect to the curving parameter F.

Figure 17A:
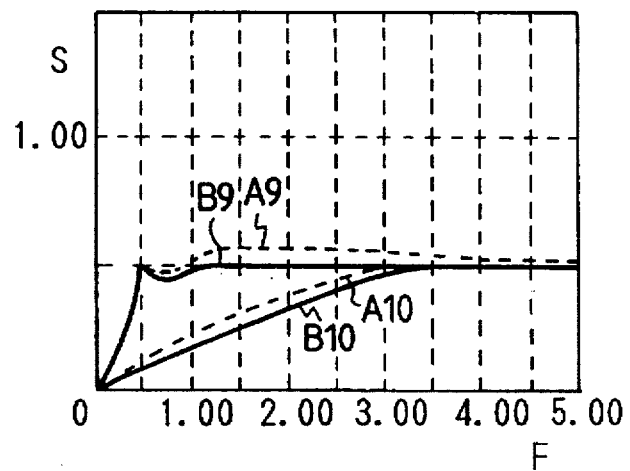
FIG. 17A is a graph showing the calculation result of an error parameter with respect to a curving parameter F in the use of the exposure position control method.
Figure 17B:
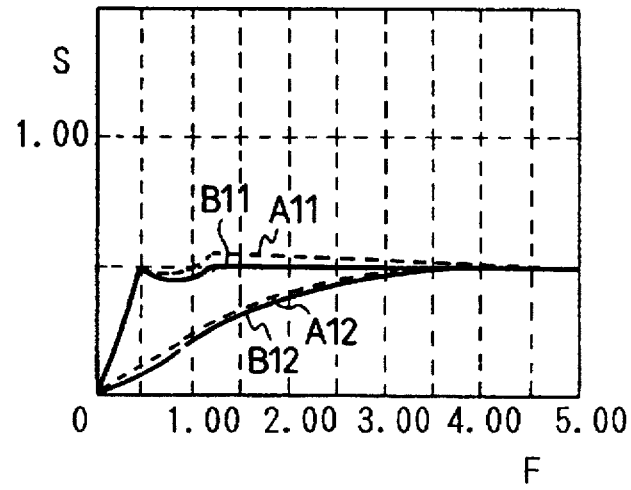
FIG. 17B is a graph showing the calculation result of an error parameter with respect to a curving parameter F in the use of the pre-read control method.

FIG. 17A shows the error parameter S with respect to the curving parameter F in a case wherein exposure position control is performed, while leveling response frequencies fm and fn in the scan and non-scan directions are respectively set to be 10 Hz and 2 Hz. Referring to FIG. 17A, both curves A9 and B9 represent the error parameters S in the non-scan direction, and both FIGS. 10A and 10B represent the error parameters S in the scan direction. FIG. 24B shows the error parameter S with respect to the curving parameter F in a case wherein pre-read control is performed, while the leveling response frequencies fm and fn in the scan and non-scan directions are respectively set to be 2.5 Hz and 0.5 Hz. Referring to FIG. 24B, both curves A11 and B11 represent the error parameters S in the non-scan direction, and both curves A12 and B12 represent the error parameters S in the scan direction.

Figure 18A:
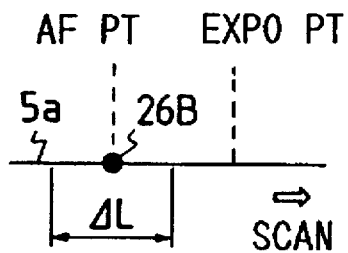
FIGS. 18A and 18B are views for explaining averaging effects in the pre-read control method.
Figure 18B:
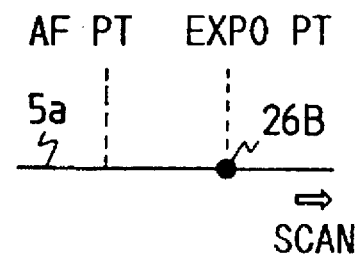

As described above, the method of removing a phase delay by pre-read control is effective in increasing the response speed but is not suitable for a case wherein the response speed is to be decreased. However, pre-read control ensures a higher degree of freedom in term of software so that time averaging and prediction/setting of a measurement point for a focus position at the start of exposure, as shown in FIGS. 18A to 18F, can be performed. More specifically, referring to FIG. 18A, a focus position is detected at a sample point (AF point) before a given area 26B on the exposure surface 5a of the wafer in the scan direction of the multi-point AF system for a period of time corresponding to a width ΔL. Subsequently, as shown in FIG. 18B, when the area 26B reaches an exposure point, the information about the focus positions detected in the range of the width ΔL is averaged to perform leveling and focusing with high precision.

Figure 18C:
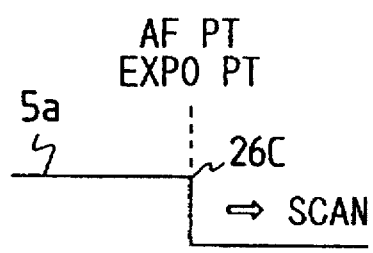
FIGS. 18C and 18D are views showing a focus plane in the execution of exposure position control.
Figure 18D:
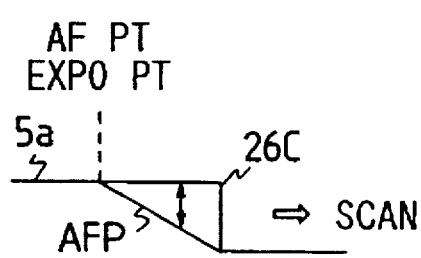
Figure 18E:
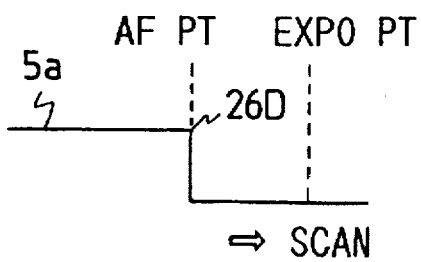
FIGS. 18E and 18F are views showing a focus plane in the execution of pre-read control.
Figure 18F:
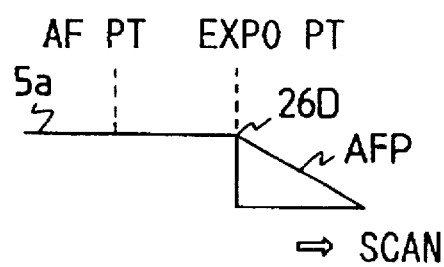

Assume that in the exposure position control method, a measurement point coincides with an exposure point, and that the exposure surface 5a of the wafer has a stepped portion 26C, as shown in FIG. 18C. In such a case, a plane (focus plane) AFP to be focused only gradually lifted, and exposure is performed in a defocused state at the stepped portion 26C, as shown in FIG. 18D. In contrast to this, in the pre-read control method, if a measurement point is separated from an exposure point, and a stepped portion 26D is formed on the exposure surface 5a of the wafer as shown in FIG. 18E, exposure is performed in an in-focus state at the stepped portion 26D by gradually lifting a focus plane AFP beforehand in accordance with the difference in level, as shown in FIG. 18F.

Note that it is preferable to devise a system which can selectively use the two control methods, i.e., the pre-read control method and the ordinal exposure position control method.

Since the autofocus mechanism and the auto-leveling mechanism in the embodiment have the above-described functions, the use of the following three control methods can be considered when control of the exposure surface of a wafer is to be actually performed: ① exposure position control, ② complete pre-read control, and ③ split pre-read control. These three types of control methods will be described in detail below.

(F) Exposure Position Control Method

Figure 19A:
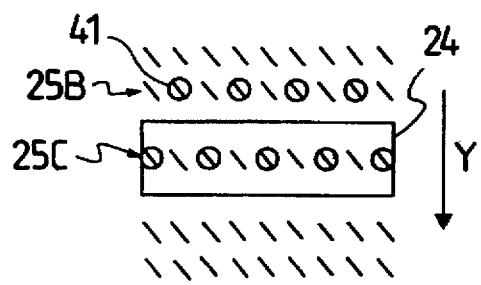
FIGS. 19A and 19B are plan views showing sample points for focus position in the execution of exposure position control.

In this method, the focus position and leveling angle of the exposure surface of a wafer are controlled by using the value of a focus position obtained by measurement in an exposure operation without considering the response performance of the autofocus and auto-leveling mechanism. More specifically, as shown in FIG. 19A, the even-numbered measurement points of a second row 25B ahead of the exposure area 24 in the scan direction (Y direction) are set as sample points 41, and the odd-numbered measurement points of a third row 25C in the exposure area 24 are also set as sample points. Leveling control of the exposure surface of the wafer in the scan direction is performed on the basis of the focus position measurement values at the sample points of the second row 25B and the focus position measurement values at the sample points of the third row 25C.

Figure 19B:
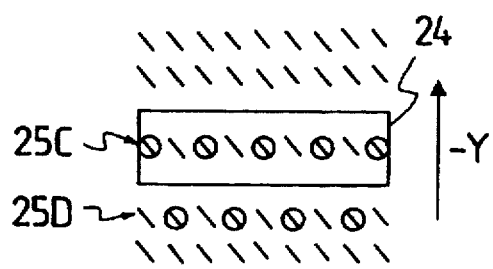

In addition, an inclination in the non-scan direction is obtained from the focus position measurement values at the sample points of the second and third rows 25B and 25C by the least square approximation method, thereby performing leveling control in the non-scan direction. Focus control is performed by using the focus position measurement values at the measurement points of the third row in the exposure area 24 as well as those obtained at the measurement points of the second row. If, as shown in FIG. 19B, the scan direction of the wafer is the -Y direction, sample points are selected from the measurement points of the third row 25C and a fourth row 25D. In this method, although simplest control can be performed, the follow-up precision changes with a change in scan speed of the wafer and the like. In addition, the method demands calibration of focus positions at the respective measurement points of the second and third rows 25B and 25C.

(G) Complete Pre-read Control Method

Figure 19C:
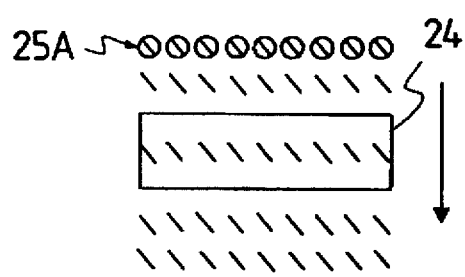
FIGS. 19C and 19D are plan views showing sample points for focus positions in the execution of complete pre-read control.
Figure 19D:
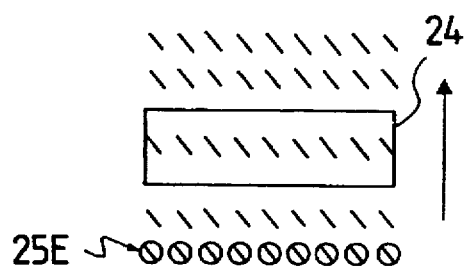

In this method, as shown in FIG. 19C, all the measurement points of a first row 25A in the upstream of the exposure area 24 in the scan direction are set as sample points, and all the focus position values at the sample points of the first row 25A are measured before exposure. Averaging processing and filtering processing are then performed, and the autofocus and auto-leveling mechanisms are controlled in an exposure operation by the open loop scheme in consideration of a phase delay. That is, the focus position measurement values at the respective sample points of the first row 25A are stored, and an inclination in the scan direction calculated from the values of focus positions measured on the time base, thereby performing leveling control in the scan direction in an exposure operation by means of open loop control.

Meanwhile, an inclination in the non-scan direction is obtained from the focus position measurement values at the respective sample points of the first row 25A by the least square approximation method, and leveling control in the non-scan direction is performed by means of open loop control. Since a pre-read operation is performed, averaging on the time base can be performed. In addition, the focus position measurement values at the respective sample points of the first row 25A are stored to perform focusing in an exposure operation by means of open loop control. Note that if the wafer is to be scanned in the -Y direction, all the measurement points of a fifth row 25E are selected as sample points.

In this method, since nine sample points can be ensured in the first row 25A, a large amount of information can be obtained, and an improvement in precision can be expected. In addition, since sample points are selected from one line, no calibration is required, and the response characteristics can be managed. On the other hand, if simple measurement is performed with respect to the sample points of the first row 25A, the distance (approach scan length) by which scan is to be performed to expose an end portion of each shot area is increased, resulting in a decrease in throughput. Furthermore, the control result cannot be checked by the multi-point AF system owing to open loop control.

(H) Split Pre-read Control method

Figure 19E:
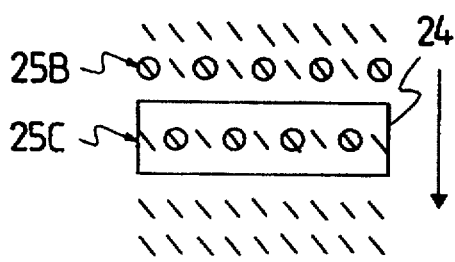
FIGS. 19E and 19F are plan views showing sample points for focus positions in the execution of split pre-read control.

In this method, as shown in FIG. 19E, odd-numbered measurement points of the second row 25B in the upstream of the exposure area 24 in the scan direction (Y direction) are set as sample points, and even-numbered measurement points of the third row 25C in the exposure area 24 are also set as sample points. Focus positions at all the sample points of the second and third rows 25B and 25C are measured before exposure. Thereafter, averaging processing and filtering processing are performed, and control is performed in an exposure operation by open loop control in consideration of a phase delay. That is, the focus position measurement values at the respective sample points of the second and third rows 25B and 25C are stored, and an inclination in the scan direction is calculated from focus positions measured on the time base, thereby performing leveling in the scan direction in an exposure operation by means of open loop control.

Figure 19F:
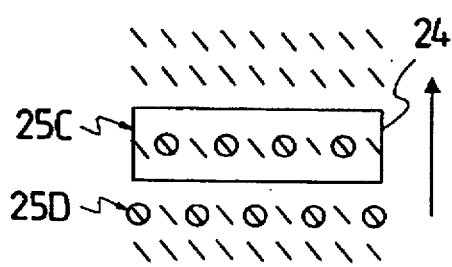

In addition, an inclination in the non-scan direction is obtained from the focus position measurement values at the sample points of the second and third rows 25B and 25C by the least square approximation method so as to perform leveling in the non-scan direction by means of open loop control. Since a pre-read operation is performed, averaging can also be performed. Furthermore, the focus position measurement values at the sample points of the second and third rows 25B and 25C are stored to perform focusing in an exposure operation by means of open loop control. Note that as shown in FIG. 19F, if the scan direction of the wafer is the -Y direction, sample points are selected from the measurement points of the third and fourth rows 25C and 25D.

In this method, since the second row 25B (or the fourth row 25D) is located near the exposure area 24, the approach scan distance for performing exposure with respect to an end portion of each shot area on the wafer can be reduced, and the response characteristics can be managed. In addition, when the exposure surface of a wafer is controlled in an exposure operation by open loop control on the basis of the focus position measurement values at the respective sample points of the third row 25C, the result can be checked. On the other hand, calibration is required with respect to the focus positions at the sample points of the second row 25B and those at the sample points of the third row.

Figure 20A:
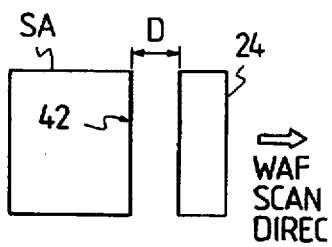
FIGS. 20A, 20B, 20C, and 20D are views for explaining a control method to be performed when exposure is performed by the complete pre-read control method.
Figure 20E:
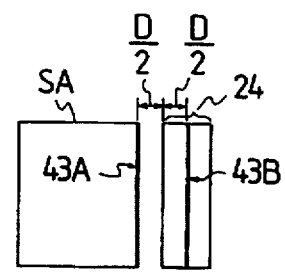
FIGS. 20E, 20F, 20G, and 20H are views for explaining a control method to be performed when exposure is performed by the split pre-read control method.
Figure 20B:
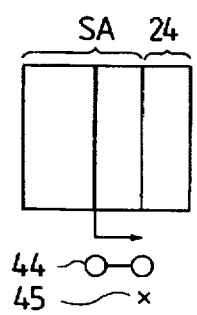

In the complete pre-read control method, as shown in FIGS. 20A to 20D, more accurate autofocus and auto-leveling control is performed by changing the sample points for focus positions at the start of exposure, during exposure, and at the end of exposure. More specifically, as shown in FIG. 20A, when a shot area SA to be exposed reaches a position where it is separated from the exposure area 24 by a distance D (equal to the width of the exposure area 24 in the scan direction), measurement of focus positions is started by the multi-point AF system at a sample area 42 located at the distance D from the exposure area 24. For example, the width D, i.e., the width of the exposure area 24 in the scan direction, is set to be 8 mm. Thereafter, as shown in FIG. 20B, when the shot area SA is brought into contact with the exposure area 24, leveling control in the scan direction is performed on the basis of the focus position measurement values in a detection area 44 between two sample points on the wafer, whereas autofocus control is performed on the basis the focus position measurement value in a detection area 45 constituted by one sample point.

Figure 20F:
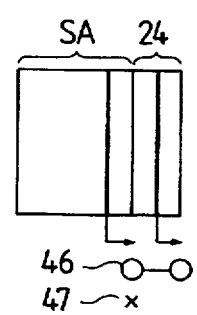
Figure 20C:
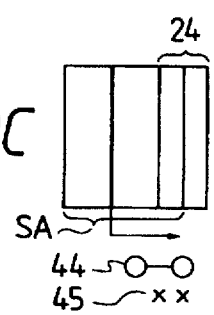

As shown in FIG. 20C, when the leading end portion of the shot area SA enters the exposure area 24, leveling control in the scan direction is performed on the basis of the focus position measurement values in the detection area 44 between the two sample points on the wafer, and autofocus control is performed on the basis of the focus position measurement values in the detection area 45 between the two sample points. In addition, as shown in FIG. 20D, when the shot area SA covers the exposure area 24, leveling control in the scan direction is performed on the basis of the focus position measurement values in the detection area 44 covering the exposure area 24, whereas autofocus control is performed on the basis of the focus position measurement values in the detection area 45 covering the exposure area 24.

In the split pre-read control method, as shown in FIGS. 20E to 20H, more accurate autofocus and auto-leveling control is also performed by changing the sample points for focus positions at the start of exposure, during exposure, and at the end of exposure. More specifically, as shown in FIG. 20E, when the shot area SA to be exposed reaches a position where it is separated from the exposure area 24 by a distance D/2 (equal to ½ the width of the exposure area 24 in the scan direction), measurement of focus positions is started by the multi-point AF system at a sample area 43 separated outward from the exposure area 24 by the distance D/2 and at a sample area 43B separated inward from the exposure area 24 by the distance D/2. Subsequently, as shown in FIG. 20F, when the leading end portion of the shot area SA is brought into contact with the exposure area 24, leveling control in the scan direction is performed on the basis of the focus position measurement values in a detection area 46 covering the exposure area 24, whereas autofocus control is performed on the basis of the measurement value in a detection area 47 constituted by one sample point.

Figure 20G:
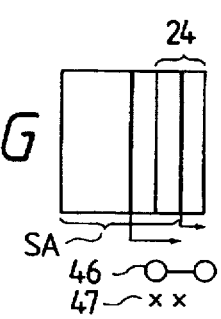
Figure 20D:
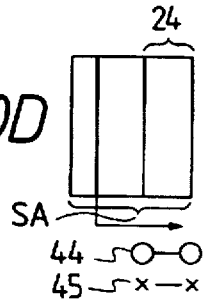
Figure 20H:
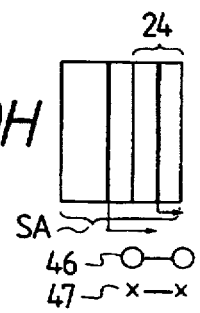
Figure 21A:
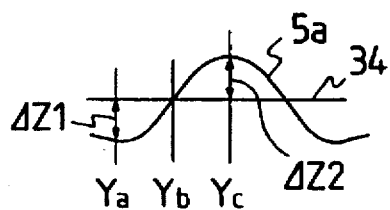
FIG. 21A is a view showing a focus error in a batch exposure operation.
Figure 21B:
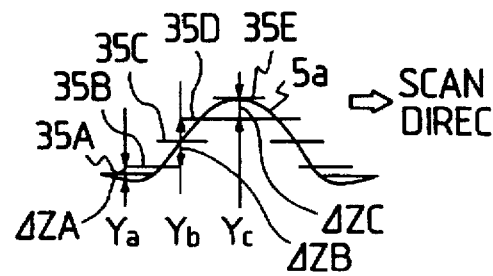
FIG. 21B is a view showing a focus error in an exposure operation performed by a scan exposure scheme.

As shown in FIG. 20G, when the leading end portion of the shot area SA enters the exposure area 24 by a width D/2, leveling control in the scan direction is performed on the basis of the focus position measurement values in the detection area 46 covering the exposure area 24, whereas autofocus control is performed on the basis of the focus position measurement values in a detection area of the width D/2. When the shot area SA covers the exposure area 24, as shown in FIG. 20H, leveling control in the scan direction is performed on the basis of the focus position measurement values in the detection area 46 covering the exposure area 24, whereas autofocus control is performed on the basis of the focus position measurement values in the detection area 47 covering the exposure area 24. As is apparent from FIGS. 20A to 20H, in the split pre-read method, the approach scan length (=D/2) can be reduced to ½ that in the complete pre-read method.

The third embodiment uses the multi-point AF system designed to project two-dimensionally arranged slit-like opening pattern images on a wafer to measure focus positions at multiple points on the exposure surface of the wafer. Instead of this system, however, the embodiment may use a one-dimensional focus position detection system for projecting images of slit-like patterns elongated in the non-scan direction on a wafer and measuring the overall focus position in the non-scan direction. In addition, even in a case wherein the distribution of two-dimensional focus positions on the exposure surface of a wafer is to be measured by using a focus position detection system of an image processing scheme, high-precision focusing and leveling can be performed by using the same split pre-read control and the like as those in the above-described embodiment.

Furthermore, in this embodiment, as is apparent from FIGS. 24A and 24B, since the leveling error in the scan direction is smaller than that in the non-scan direction, a leveling operation may be performed only in the non-scan direction.

What is claimed is:

1. A method that provides synchronized relative movement between a mask and a photosensitive substrate in a predetermined direction to expose a pattern of the mask on a partitioned area on the photosensitive substrate through a projection optical system, and that comprises the steps of:

detecting a deviation between the partitioned area on the photosensitive substrate, separated from a projection area on which the pattern of the mask is to be projected by said projection optical system by a predetermined distance in the predetermined direction, and an imaging plane of said projection optical system, after said relative movement of the mask and the photosensitive substrate is started; and moving the photosensitive substrate along an optical axis of the projection optical system when the partitioned area reaches the projection area, thereby causing the partitioned area to coincide with the imaging plane of said projection optical system.

2. A method that provides synchronized relative movement between a mask and a photosensitive substrate to expose a pattern of the mask on a partitioned area on the photosensitive substrate through a projection optical system, and that comprises the steps of:

detecting an inclination amount between an imaging plane of said projection optical system and a surface of said partitioned area on the photosensitive substrate, separated from a projection area on which the pattern of the mask is to be projected by said projection optical system by a predetermined distance after said relative movement of the mask and the photosensitive substrate is started; and relatively inclining the photosensitive substrate and the imaging plane in accordance with the detected inclination amount when the partitioned area reaches the projection area, thereby setting the partitioned area surface to be substantially parallel to the imaging plane of said projection optical system.

3. A method that provides synchronized relative movement between a mask and a radiation-sensitive substrate, to expose a section area on said substrate with an image of a pattern of said mask, through a projection optical system, and that comprises the following steps:

detecting data relating to an error between at least one point in said section area and an image plane of said projection optical system, before said section area comes within a projection area of said projection optical system, by the relative movement; and moving the image plane of said projection optical system and said substrate relative to each other, based on a result of the detecting, during the relative movement between said mask and said substrate, whereby the image plane is coincident with said section area within the projection area.

4. A method according to claim 3, wherein said detecting step includes detecting data relating to at least one deviation between said section area and said image plane along an optical axis of said projection optical system, and wherein said moving step includes moving said substrate along said optical axis to achieve the coincidence.

5. A method according to claim 4, wherein the coincidence is achieved based on a maximum value and a minimum value of a plurality of detected deviations.

6. A method according to claim 5, wherein said moving step includes moving said substrate to a focus position Z which is defined by the following equation:

$$Z = (M \cdot Zmax + N \cdot Zmin)/(M+N)$$

where

Zmax: a maximum value of the deviations;
Zmin: a minimum value of the deviations;
M: a predetermined coefficient; and
N: a predetermined coefficient.

7. A method according to claim 3, wherein said detecting step includes detecting data relating to a relative inclination amount of said section area and said image plane, and wherein said moving step includes inclining said substrate and said image plane relatively to achieve the coincidence.

8. A method according to claim 7, wherein said inclining step includes inclining said substrate and said image plane relatively with respect to a direction substantially perpendicular to a direction of said relative movement.

9. A method according to claim 3, further comprising:

exposing said section area with the image of the pattern of said mask through said projection optical system.

10. A method according to claim 9, further comprising:

providing further synchronized relative movement of said mask and said substrate to expose a following section area after the first-recited section area, and detecting data relating to an error between at least one point in said following section area and the image plane of said projection optical system during a settling interval for settling a moving speed of said mask.

11. A method according to claim 3, wherein said detecting step includes:

illuminating at least one point in said section area with light in an oblique direction; and receiving light reflected from said at least one point in said section area.

12. A method according to claim 11, wherein the illuminating light is in the shape of a rectangle.

13. A method according to claim 11, wherein the illuminating light has a wavelength to which said substrate has low sensitivity.

14. A method according to claim 3, wherein said detecting step includes:

illuminating at least one point in said section area with light having a plurality of patterns; and receiving light reflected from said section area by a plurality of light receiving portions.

15. A method according to claim 3, wherein, in said relative movement between said mask and said substrate said mask and said substrate are moved in different directions, and wherein said detecting step includes selecting one of a plurality of measuring points in accordance with a moving direction of said substrate.

16. A method according to claim 3, wherein a plurality of detection points to be detected in said section area are arranged along a direction substantially perpendicular to a moving direction of said substrate.

17. A method according to claim 3, wherein said moving step includes:

inclining said substrate in a direction of said relative movement; and inclining said substrate in a direction substantially perpendicular to said relative movement direction.

18. A method according to claim 17, wherein a response speed at which said substrate is inclined in said relative movement direction is different from a response speed at which said substrate is inclined in the direction substantially perpendicular to said relative movement direction.

19. A method according to claim 3, wherein a speed of said relative movement is determined based on a light sensitivity of said substrate or a light amount of an exposing light with which said substrate is illuminated.

20. A method according to claim 3, wherein said detecting step also includes detecting data relating to an error between at least one point in said section area and said image plane of said projection optical system when a part of said section area comes within said projection area.

21. A method according to claim 20, wherein said at least one point in said section area before said section area comes within said projection area and said at least one point in said section area when said part of said section area comes within said projection area are different measuring points.

22. A method according to claim 3, further comprising:
detecting data relating to an error between at least one point in a following section area to be exposed after the first-recited section area, and said image plane of said projection optical system, after moving the image plane of said projection optical system and said substrate relative to each other; and
further moving the image plane of said projection optical system and said substrate relative to each other based on the data relating to the error between said at least one point in said following section area and the image plane of said projection optical system, wherein said further moving of the image plane of said projection optical system and said substrate relative to each other is performed based on a preceding amount of relative movement of the image plane of said projection optical system and said substrate.

23. A method that provides synchronized relative movement between a mask and a radiation-sensitive substrate, to expose a section area on said substrate with an image of a pattern of said mask, through a projection optical system, and that comprises the following steps:
detecting a positional deviation along an optical axis of said projection optical system between a surface of said section area and an image plane of said projection optical system, at a front side of said projection area of said projection optical system in relation to a movement direction of said substrate, during said movement; and
moving said substrate along the optical axis in accordance with the detected positional deviation, after said section area reaches said projection area due to the movement, whereby the image plane is coincident with said section area within the projection area.

24. A method according to claim 23, wherein a positional deviation is detected at each of a plurality of points within said section area, and said substrate is inclined in accordance with the detected positional deviations.

25. A method that provides synchronized relative movement between a mask and a radiation-sensitive substrate, to expose a section area on said substrate with an image of a pattern of said mask, through a projection optical system, and that comprises the following steps:
detecting an inclination amount between a surface of said section area and an image plane of said projection optical system, at a front side of said projection area of said projection optical system in relation to a movement direction of said substrate, during said movement; and
inclining said substrate in accordance with the detected inclination amount, after said section area reaches said projection area due to the movement, whereby the image plane is coincident with said section area within the projection area.

* * * * *